US012405523B2

(12) United States Patent
Li et al.

(10) Patent No.: US 12,405,523 B2
(45) Date of Patent: Sep. 2, 2025

(54) LASER PROJECTION APPARATUS

(71) Applicant: Hisense Laser Display Co., Ltd, Qingdao (CN)

(72) Inventors: Wei Li, Qingdao (CN); Xiaoqiang Gu, Qingdao (CN); Youliang Tian, Qingdao (CN)

(73) Assignee: HISENSE LASER DISPLAY CO., LTD, Qingdao (CN)

(*) Notice: Subject to any disclaimer, the term of this patent is extended or adjusted under 35 U.S.C. 154(b) by 377 days.

(21) Appl. No.: 17/946,318

(22) Filed: Sep. 16, 2022

(65) Prior Publication Data
US 2023/0020534 A1 Jan. 19, 2023

Related U.S. Application Data

(63) Continuation of application No. PCT/CN2021/081818, filed on Mar. 19, 2021.

(30) Foreign Application Priority Data

Mar. 31, 2020 (CN) ............ 202010247119.4
Mar. 31, 2020 (CN) ............ 202010247120.7

(51) Int. Cl.
G03B 21/20 (2006.01)
G03B 21/14 (2006.01)
H04N 9/31 (2006.01)

(52) U.S. Cl.
CPC ....... *G03B 21/2066* (2013.01); *G03B 21/142* (2013.01); *H04N 9/3152* (2013.01); *H04N 9/3161* (2013.01)

(58) Field of Classification Search
CPC ............. G03B 21/2066; G03B 21/142; G03B 21/2033; G03B 21/208; G03B 21/2013;
(Continued)

(56) References Cited

U.S. PATENT DOCUMENTS

2011/0037953 A1 2/2011 Nizani et al.
2012/0281186 A1* 11/2012 Hsiung ............... H04N 9/3129
353/31
(Continued)

FOREIGN PATENT DOCUMENTS

CN 101815376 A 8/2010
CN 101855902 A 10/2010
(Continued)

OTHER PUBLICATIONS

International Search Report (PCT/ISA/210) and Written Opinion (PCT/ISA/237) issued in PCT Application No. PCT/CN2021/081818 dated Jun. 9, 2021 with English Translation.
(Continued)

*Primary Examiner* — Magda Cruz
(74) *Attorney, Agent, or Firm* — Morgan, Lewis & Bockius LLP

(57) ABSTRACT

A laser projection apparatus includes a laser source assembly, an optical engine and a projection lens. The laser source assembly includes a laser device and a combining lens group. The laser device includes a first laser-exit region emitting laser beams of first color, a second laser-exit region emitting laser beams of second color, and a third laser-exit region emitting laser beams of third color. The combining lens group includes a plurality of combining lenses and a beam spot adjustment structure. The beam spot adjustment structure is disposed in beam paths of the laser beams of first color and the laser beams of second color before being combined with the laser beams of third color, and the beam spot adjustment structure is configured to increase a divergence angle of at least one of the laser beams of first color or the laser beams of second color.

20 Claims, 12 Drawing Sheets

(58) Field of Classification Search
CPC .. H04N 9/3152; H04N 9/3161; H04N 9/3164; H01S 5/06
See application file for complete search history.

(56) References Cited

U.S. PATENT DOCUMENTS

| | | | |
|---|---|---|---|
| 2014/0168611 A1* | 6/2014 | Wu | G03B 21/2033 353/31 |
| 2016/0085141 A1 | 3/2016 | Hu et al. | |
| 2016/0211652 A1 | 7/2016 | Fischer et al. | |
| 2016/0363745 A1 | 12/2016 | Kubota | |
| 2017/0115500 A1 | 4/2017 | Tian et al. | |
| 2017/0115554 A1 | 4/2017 | D'Oosterlinck et al. | |
| 2018/0224732 A1 | 8/2018 | Tian et al. | |
| 2019/0250493 A1 | 8/2019 | Fujii | |
| 2019/0294035 A1 | 9/2019 | Chien et al. | |
| 2020/0301263 A1* | 9/2020 | Li | G03B 21/008 |
| 2020/0301265 A1* | 9/2020 | Yan | H04N 9/3152 |
| 2020/0401027 A1* | 12/2020 | Zhao | G03B 21/2033 |

FOREIGN PATENT DOCUMENTS

| | | |
|---|---|---|
| CN | 102360124 A | 2/2012 |
| CN | 103901707 A | 7/2014 |
| CN | 104808425 A | 7/2015 |
| CN | 104972221 A | 10/2015 |
| CN | 105093795 A | 11/2015 |
| CN | 105137610 A | 12/2015 |
| CN | 204832751 U | 12/2015 |
| CN | 204989735 U | 1/2016 |
| CN | 106383429 A | 2/2017 |
| CN | 107092156 A | 8/2017 |
| CN | 107797295 A | 3/2018 |
| CN | 107885020 A | 4/2018 |
| CN | 108008593 A | 5/2018 |
| CN | 108303840 A | 7/2018 |
| CN | 207663203 U | 7/2018 |
| CN | 109991802 A | 7/2019 |
| CN | 110161788 A | 8/2019 |
| CN | 110275373 A | 9/2019 |
| CN | 111258165 A | 6/2020 |
| CN | 111562713 A | 8/2020 |
| CN | 106785895 A | 4/2021 |
| EP | 3070939 A1 | 9/2016 |
| JP | 2015-169710 A | 9/2015 |
| WO | 2019196428 A1 | 10/2019 |

OTHER PUBLICATIONS

Office Action issued in corresponding Chinese Patent Application No. 202010247119.4 dated Jul. 29, 2022 with English Translation.
Office Action issued in corresponding Chinese Patent Application No. 202010247120.7 dated Aug. 11, 2022 with English Translation.

* cited by examiner

LASER PROJECTION APPARATUS

CROSS-REFERENCE TO RELATED APPLICATIONS

This application is a continuation application of International Application No. PCT/CN2021/081818, filed on Mar. 19, 2021, which claims priorities to Chinese Patent Application No. 202010247119.4, filed on Mar. 31, 2020, and Chinese Patent Application No. 202010247120.7, filed on Mar. 31, 2020, which are incorporated herein by reference in their entireties.

TECHNICAL FIELD

The present disclosure relates to the field of laser projection technologies, and in particular, to a laser projection apparatus.

BACKGROUND

With the development of laser projection technology, laser devices are increasingly used as laser sources in laser projection apparatuses. A laser beam has characteristics of good monochromaticity, high luminance and long service life. Moreover, compared with light-emitting diodes (LEDs), laser devices have smaller etendue and higher luminance.

SUMMARY

A laser projection apparatus is provided. The laser projection apparatus includes a laser source assembly, an optical engine and a projection lens. The laser source assembly is configured to emit illumination beams. The optical engine is configured to modulate the illumination beams emitted by the laser source assembly, so as to obtain projection beams. The projection lens is configured to project the projection beams into an image. The laser source assembly includes a laser device and a combining lens group. The laser device includes a first laser-exit region, a second laser-exit region and a third laser-exit region. The first laser-exit region emits laser beams of first color. The second laser-exit region emits laser beams of second color. The third laser-exit region emits laser beams of third color. The combining lens group includes a plurality of combining lenses and a beam spot adjustment structure. The plurality of combining lenses correspond to the first laser-exit region, the second laser-exit region and the third laser-exit region respectively. The plurality of combining lenses are configured to combine the laser beams of first color, the laser beams of second color and the laser beams of third color, and emit the combined laser beams to a beam outlet of the laser source assembly. The beam spot adjustment structure is disposed in beam paths of the laser beams of first color and the laser beams of second color before being combined with the laser beams of third color, and the beam spot adjustment structure is configured to increase a divergence angle of at least one of the laser beams of first color or the laser beams of second color. The laser beams exiting from the beam outlet of the laser source assembly constitutes the illumination beams.

BRIEF DESCRIPTION OF THE DRAWINGS

In order to describe technical solutions in the present disclosure more clearly, the accompanying drawings to be used in some embodiments of the present disclosure will be introduced briefly. However, the accompanying drawings to be described below are merely some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
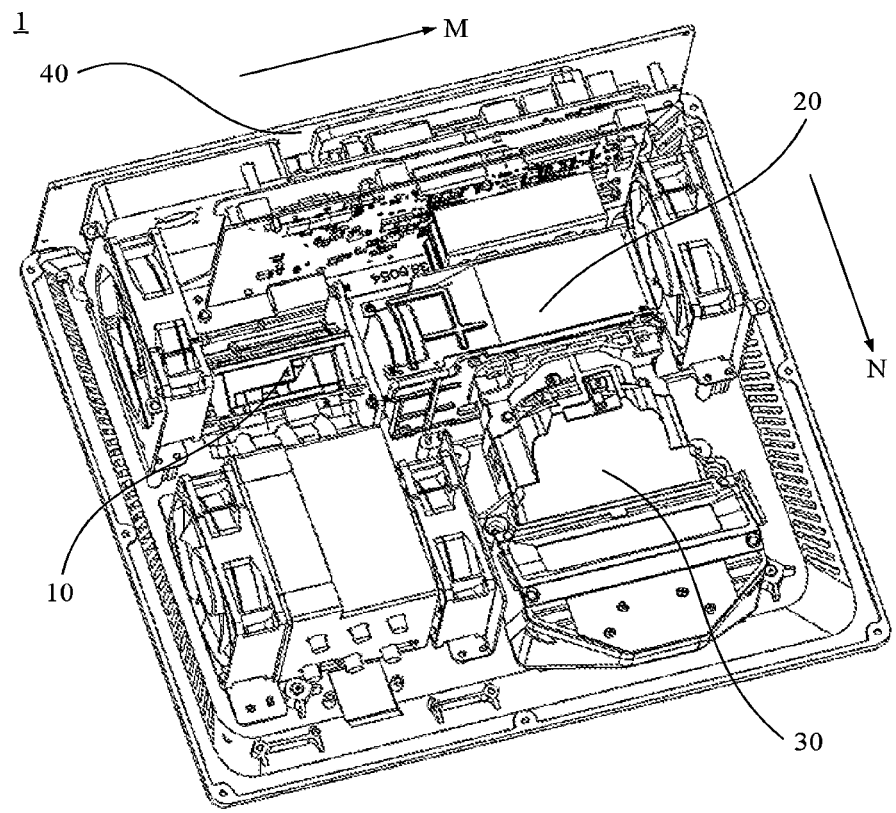
FIG. 1 is a diagram showing a structure of a laser projection apparatus, in accordance with some embodiments.

Some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, terms such as "first" and "second" are used for descriptive purposes only, and are not to be construed as indicating or implying the relative importance or implicitly indicating the number of indicated technical features. Thus, features defined by "first" or "second" may explicitly or implicitly include one or more of the features. In the description of the embodiments of the present disclosure, unless otherwise specified, the term "a/the plurality of" means two or more.

In the description of some embodiments, the expression "connected" and its derivative may be used. For example, the term "connected" may be used in the description of some embodiments to indicate that two or more components are in direct physical or electrical contact with each other. However, the term "connected" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

The use of the phrase "applicable to" or "configured to" herein means an open and inclusive expression, which does not exclude apparatuses that are applicable to or configured to perform additional tasks or steps.

The term such as "about", "substantially" or "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

The term such as "parallel", "perpendicular" or "equal" as used herein includes a stated condition and a condition similar to the stated condition. A range of the similar condition is within an acceptable deviation range, and the acceptable deviation range is determined by a person of ordinary skill in the art, considering measurement in question and errors associated with measurement of a particular quantity (i.e., limitations of a measurement system).

In some embodiments of the present disclosure, a laser projection apparatus 1 is provided. FIG. 1 is a diagram showing a structure of a laser projection apparatus, in accordance with some embodiments. As shown in FIG. 1, the laser projection apparatus 1 includes an apparatus housing 40 (only a portion of the apparatus housing 40 being shown in FIG. 1), and a laser source assembly 10, an optical engine 20, and a projection lens 30 that are assembled in the apparatus housing 40. The laser source assembly 10 is configured to provide illumination beams (laser beams). The optical engine 20 is configured to modulate the illumination beams provided by the laser source assembly 10 with image signals, so as to obtain projection beams. The projection lens 30 is configured to project the projection beams into an image on a screen or a wall.

The laser source assembly 10, the optical engine 20, and the projection lens 30 are sequentially connected in a propagation direction of beams, and are each wrapped by a corresponding housing. The housings of the laser source assembly 10, the optical engine 20 and the projection lens 30 support their corresponding optical components respectively and make the optical components meet certain sealing or airtight requirements.

Figure 2:
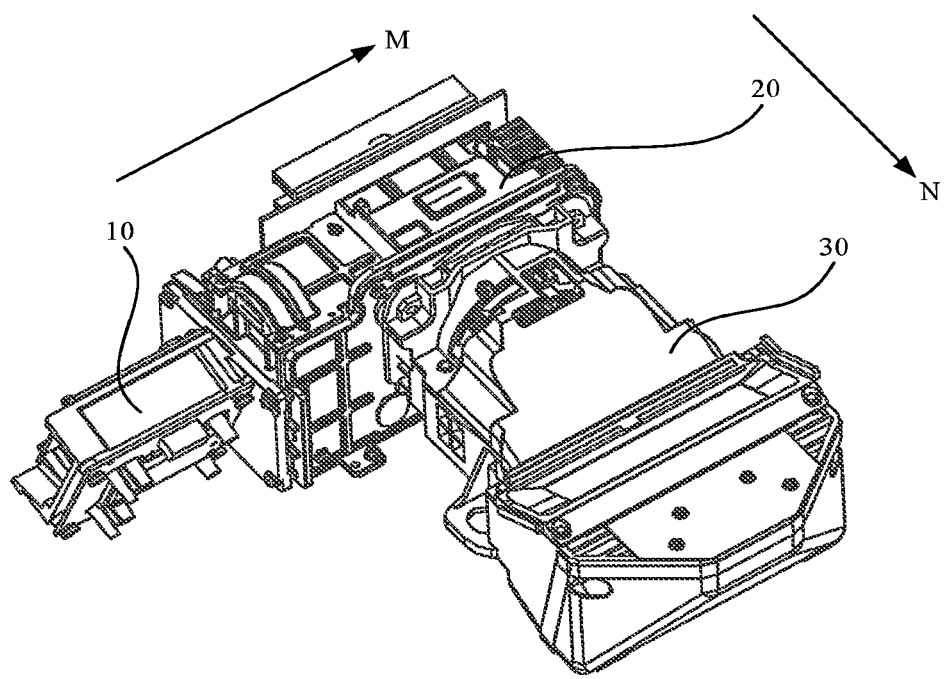
FIG. 2 is a diagram showing a partial structure of a laser projection apparatus, in accordance with some embodiments.

FIG. 2 is a diagram showing a partial structure of a laser projection apparatus, in accordance with some embodiments.

An end of the optical engine 20 is connected to the laser source assembly 10, and the laser source assembly 10 and the optical engine 20 are arranged in an exit direction of the illumination beams of the laser projection apparatus 1 (referring to the M direction shown in FIG. 2). Another end of the optical engine 20 is connected to the projection lens 30, and the optical engine 20 and the projection lens 30 are arranged in an exit direction of the projection beams of the laser projection apparatus 1 (referring to the N direction shown in FIG. 2). The exit direction M of the illumination beams is substantially perpendicular to the exit direction N of the projection beams. On one hand, such a connection structure may adapt to characteristics of a beam path of a reflective light valve in the optical engine 20, and on another hand, it is also conducive to shortening a length of a beam path in a one-dimensional direction, which is helpful for structural arrangement of the apparatus. For example, in a case where the laser source assembly 10, the optical engine 20, and the projection lens 30 are disposed in the one-dimensional direction (e.g., the direction M), a length of a beam path in the one-dimensional direction is long, which is not conducive to the structural arrangement of the apparatus. The reflective light valve will be described below.

In some embodiments, the laser source assembly 10 may provide beams of three primary colors sequentially (beams of other colors may also be added on a basis of the beams of three primary colors). Due to a phenomenon of visual persistence of human eyes, what the human eyes see is white beams formed by mixing the beams of three primary colors. Alternatively, the laser source assembly 10 may also simultaneously output the beams of three primary colors, so as to continuously emit the white beams. The laser source assembly 10 includes a laser device. The laser device may emit laser beams of at least one color, such as red laser beams, blue laser beams or green laser beams.

Figure 3:
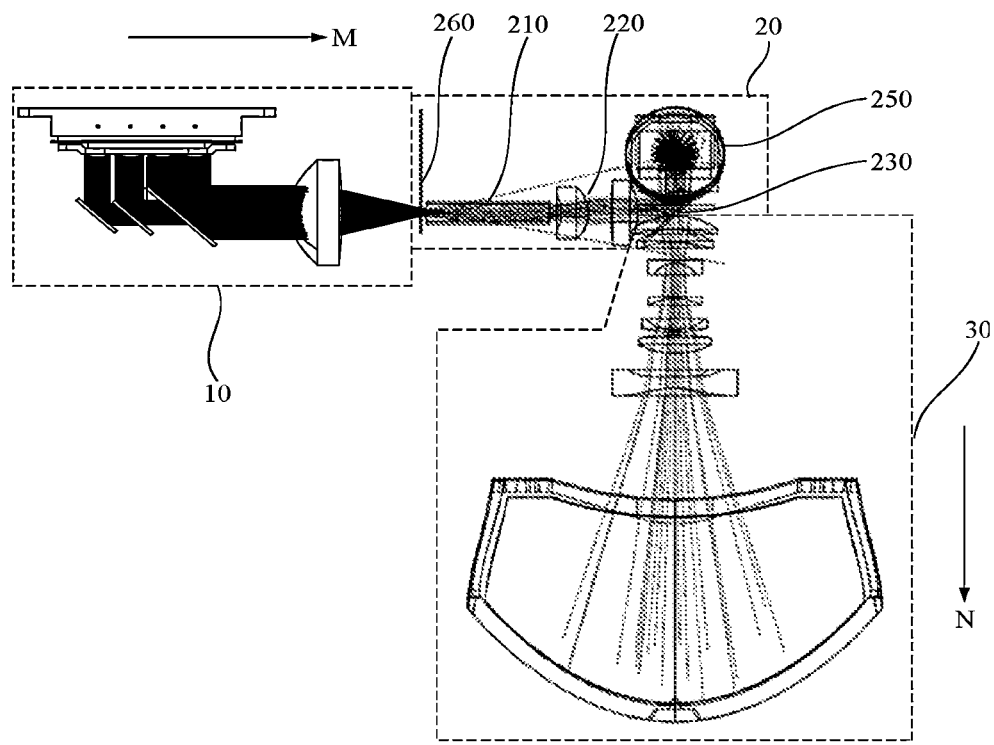
FIG. 3 is a diagram showing a beam path of a laser source assembly, an optical engine, and a projection lens in a laser projection apparatus, in accordance with some embodiments.
Figure 4:
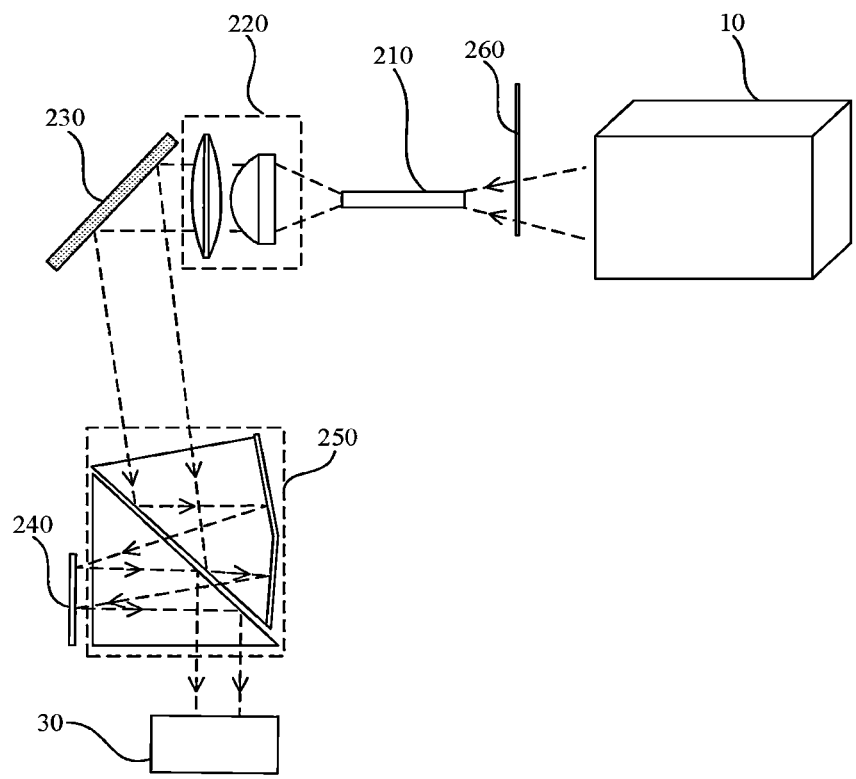
FIG. 4 is a diagram showing another beam path of a laser source assembly, an optical engine, and a projection lens in a laser projection apparatus, in accordance with some embodiments.

FIG. 3 is a diagram showing a beam path of a laser source assembly, an optical engine, and a projection lens in a laser projection apparatus, in accordance with some embodiments. FIG. 4 is a diagram showing another beam path of a laser source assembly, an optical engine, and a projection lens in a laser projection apparatus, in accordance with some embodiments.

The illumination beams emitted by the laser source assembly 10 enter the optical engine 20. Referring to FIGS. 3 and 4, the optical engine 20 includes a light pipe 210, a lens assembly 220, a reflector 230, a digital micromirror device (DMD) 240 and a prism assembly 250. The light pipe 210 may receive the illumination beams provided by the laser source assembly 10 and homogenize the illumination beams. The lens assembly 220 may first collimate the illumination beams, and then converge the collimated illumination beams and emit the converged illumination beams to the reflector 230. The reflector 230 may reflect the illumination beams to the prism assembly 250. The prism assembly 250 reflects the illumination beams to the digital micromirror device 240. The digital micromirror device 240 modulates the illumination beams, so as to obtain the projection beams, and reflects the projection beams into the projection lens 30.

Figure 5:
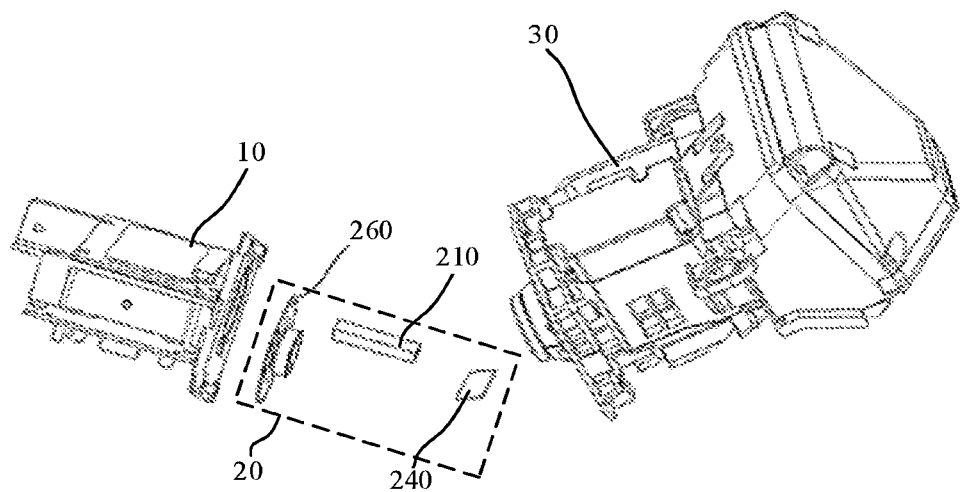
FIG. 5 is a diagram showing a structure of a laser source assembly, an optical engine, and a projection lens in a laser projection apparatus, in accordance with some embodiments.

FIG. 5 is a diagram showing a structure of a laser source assembly, an optical engine, and a projection lens in a laser projection apparatus, in accordance with some embodiments.

In some embodiments, as shown in FIGS. 3 and 5, the optical engine 20 of the laser projection apparatus 1 further includes a diffusion component 260. The diffusion component 260 is located on a laser-exit side of the laser source assembly 10 and configured to homogenize the illumination beams emitted by the laser source assembly 10. The diffusion component 260 may include a diffusion wheel, and the diffusion wheel includes a diffusion sheet and a shaft. The diffusion sheet may be rotated around the shaft passing through a center point of the diffusion sheet and perpendicular to the diffusion sheet, so that the laser beams may be incident on different positions of the diffusion sheet at different moments, which makes divergence angles of the laser beams at different moments different. In this way, speckle patterns with different shapes and positions formed by the laser beams during projection are dispersed and overlapped by the laser projection apparatus 1, therefore the speckles are eliminated. Of course, the diffusion component 260 may also be provided in the laser source assembly 10.

In the optical engine 20, the DMD 240 plays a role of modulating the illumination beams provided by the laser source assembly 10 through the image signals. That is, the DMD 240 controls the projection beams to display different luminance and gray scales according to different pixels of an image to be displayed, so as to finally produce an optical image. Therefore, the DMD 240 is also referred to as an optical modulator or a light valve. Depending on whether the optical modulator (or the light valve) transmits or reflects the illumination beams, the optical modulator (or the light valve) may be classified as a transmissive optical modulator (or light valve) or a reflective optical modulator (or light valve). For example, the DMD 240 shown in FIG. 4 reflects the illumination beams, and thus it is the reflective optical modulator. A liquid crystal light valve transmits the illumination beams, and thus it is the transmissive optical modulator. In addition, according to the number of the optical modulators (or the light valves) used in the optical engine 20, the optical engine 20 may be classified as a single-chip system, a double-chip system, or a three-chip system. For example, only one DMD 240 is used in the optical engine 20 shown in FIG. 4, and thus the optical engine 20 may be referred to as the single-chip system. In a case where three digital micromirror devices 240 are used, the optical engine 20 may be referred to as the three-chip system.

It will be noted that, according to a projection architecture, the optical modulators (or the light valves) may be of many different kinds, such as a liquid crystal on silicon (LCOS), a liquid crystal display (LCD) or a digital micromirror device (DMD). Since the optical engine 20 shown in FIG. 4 applies a digital light processing (DLP) projection architecture in some embodiments of the present disclosure, the optical modulators (or the light valves) in some embodiments of the present disclosure are digital micromirror devices (DMD) 240.

Figure 6:
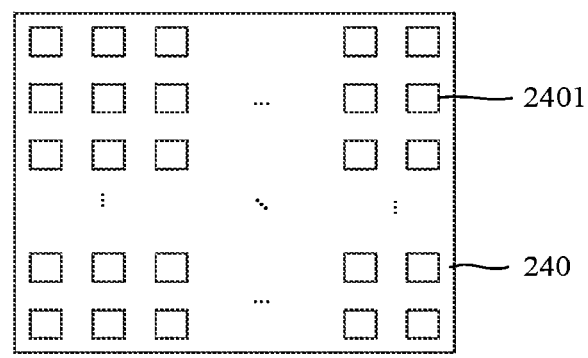
FIG. 6 is a diagram showing an arrangement of micromirrors in a digital micromirror device, in accordance with some embodiments.
Figure 7:
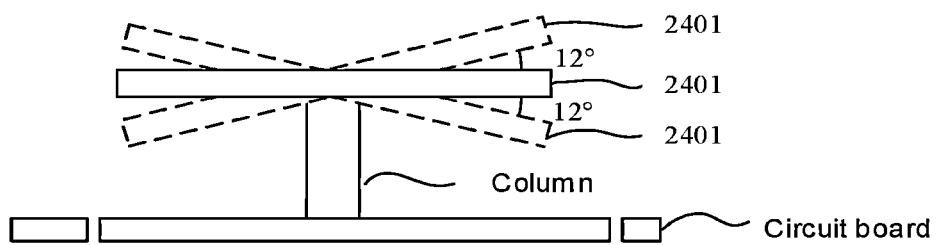
FIG. 7 is a diagram showing a swing position of a micromirror in the digital micromirror device shown in FIG. 6.
Figure 8:
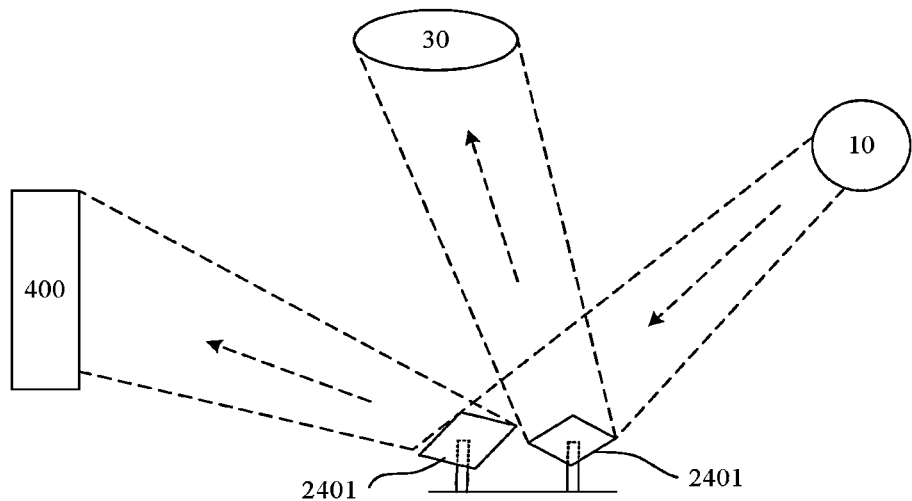
FIG. 8 is a schematic diagram showing operation of micromirrors, in accordance with some embodiments.

FIG. 6 is a diagram showing an arrangement of micromirrors in a digital micromirror device, in accordance with some embodiments. FIG. 7 is a diagram showing a swing position of a micromirror in the digital micromirror device shown in FIG. 6. FIG. 8 is a schematic diagram showing operation of micromirrors, in accordance with some embodiments.

As shown in FIGS. 6 and 7, the digital micromirror device 240 includes thousands of micromirrors 2401 that may be individually driven. These micromirrors 2401 are arranged in an array, and each micromirror 2401 corresponds to one pixel in the image to be displayed. In the DLP projection architecture, each micromirror 2401 is equivalent to a digital switch. The micromirror may swing within a range of plus or minus 12 degrees (i.e., ±12°) or a range of plus or minus 17 degrees (i.e., ±17°) due to an action of an external force.

As shown in FIG. 8, a laser beam reflected by the micromirror 2401 at a negative deflection angle is referred to as an OFF laser beam, and the OFF laser beam is an ineffective laser beam, and which usually irradiates on the housing of the optical engine 20, or is absorbed by a laser absorption portion 400. A laser beam reflected by the micromirror 2401 at a positive deflection angle is referred to as an ON laser beam. The ON laser beam is an effective beam reflected by the micromirror 2401 on a surface of the DMD 240 when it receives irradiation of the illumination beams, and the ON laser beam enters the projection lens 30 at a positive deflection angle for projection imaging. An ON state of the micromirror 2401 is a state that the micromirror 2401 is in and may be maintained when the illumination beams emitted by the laser source assembly 10 may enter the projection lens 30 after being reflected by the micromirror 2401. That is, the micromirror 2401 is in a state of the positive deflection angle. An OFF state of the micromirror 2401 is a state that the micromirror 2401 is in and may be maintained when the illumination beams emitted by the laser source assembly 10 does not enter the projection lens 30 after being reflected by the micromirror 2401. That is, the micromirror 2401 is in a state of the negative deflection angle.

In a display cycle of a frame of an image, some or all of the micromirrors 2401 are switched once between the ON state and the OFF state, so that gray scales of pixels in the frame image are achieved according to durations of the micromirrors 2401 in the ON state and the OFF state. For example, in a case where the pixels have 256 gray scales from 0 to 255, micromirrors 2401 corresponding to a gray scale 0 are each in the OFF state in an entire display cycle of the frame of the image, micromirrors 2401 corresponding to a gray scale 255 are each in the ON state in the entire display cycle of the frame of the image, and micromirrors 2401 corresponding to a gray scale 127 are each in the ON state for a half of time and in the OFF state for another half of time in the display cycle of the frame of the image. Therefore, by controlling a state that each micromirror 2401 in the DMD 240 is in and a duration of each state in the display cycle of the frame of the image through the image signals, luminance (the gray scale) of a pixel corresponding to the micromirror 2401 may be controlled, thereby modulating the illumination beams projected onto the DMD 240.

The light pipe 210, the lens assembly 220 and the reflector 230 at a front end of the DMD 240 form an illumination path, and the illumination beams emitted by the laser source assembly 10 pass through the illumination path to have a size and an incident angle which are met the requirements of the DMD 240.

As shown in FIG. 3, the projection lens 30 includes a combination of a plurality of lenses, which are usually divided by groups, and are divided into a three-segment combination including a front group, a middle group and a rear group, or a two-segment combination including a front group and a rear group. The front group is a lens group proximate to a laser-exit side of the laser projection apparatus 1 (e.g., a side of the projection lens 30 away from the optical engine 20 along the N direction in FIG. 3), and the rear group is a lens group proximate to a laser-exit side of the optical engine 20 (e.g., a side of the projection lens 30 proximate to the optical engine 20 along the opposite direction of the N direction in FIG. 3). The projection lens 30 may be a zoom projection lens, or a prime focus-adjustable projection lens, or a prime projection lens.

In some embodiments, the laser projection apparatus 1 is an ultra-short-focus laser projection apparatus, and the projection lens 30 is an ultra-short-focus projection lens. A projection ratio of the projection lens 30 is usually less than 0.3, such as 0.24. In a case of a same projection distance, the smaller the projection ratio, the larger the projection image of the laser projection apparatus 1 is. The ultra-short-focus projection lens with a small projection ratio may adapt to a narrow space while ensuring the projection effect. In this way, the laser projection apparatus 1 may perform the large-sized projection display with a small projection ratio.

For ease of description, some embodiments of the present disclosure are mainly described by taking an example in which the laser source assembly 10 sequentially outputs the beams of three primary colors, the laser projection apparatus 1 adopts the DLP projection architecture, the optical modulator of the optical engine 20 is the digital micromirror device 240, and the projection lens 30 is the ultra-short-focus projection lens, however, this should not be construed as a limitation of the present disclosure.

The laser source assembly 10 according to some embodiments of the present disclosure will be described in detail below.

Figure 9:
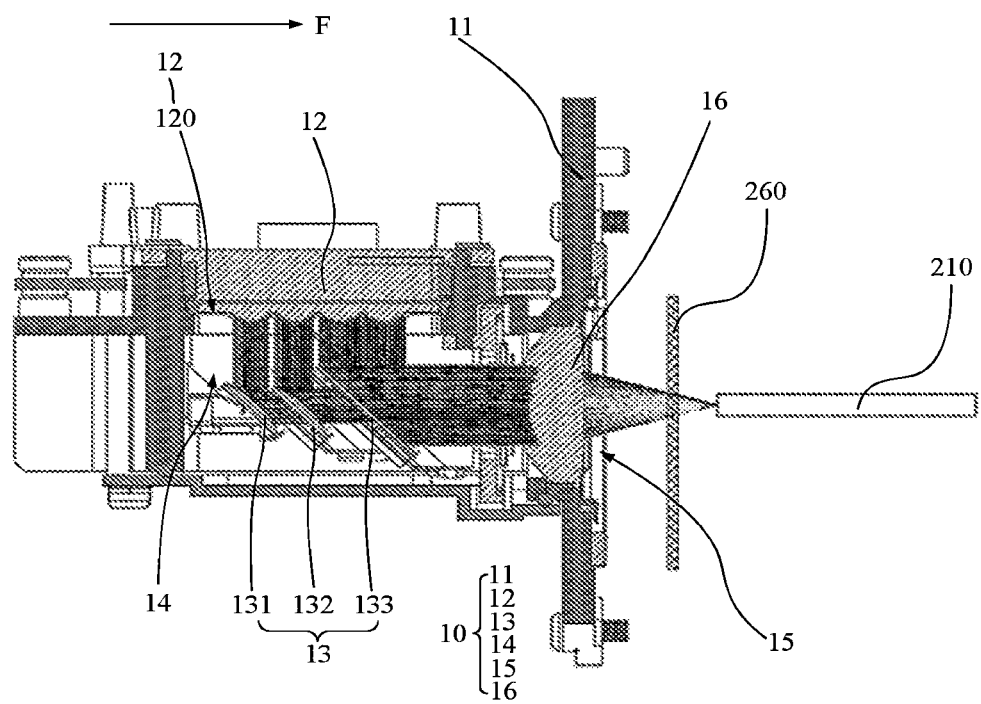
FIG. 9 is a diagram showing a structure of a laser source assembly in a laser projection apparatus, in accordance with some embodiments.

FIG. 9 is a diagram showing a structure of a laser source assembly in a laser projection apparatus, in accordance with some embodiments. As shown in FIG. 9, the laser source assembly 10 of the laser projection apparatus 1 includes a laser source housing 11, a laser device 12, a combining lens group 13, an accommodating cavity 14 and a beam outlet 15. An interior of the laser source housing 11 is hollow, so as to form the accommodating cavity 14, and at least part of the laser device 12 is located in the accommodating cavity 14. The combining lens group 13 is disposed on a laser-exit side of the laser device 12 and located in the accommodating cavity 14, the beam outlet 15 is disposed on the laser source housing 11 and communicates with the accommodating cavity 14, and the beam outlet 15 is located on a laser-exit side of the combining lens group 13. The laser source assembly 10 may emit laser beams of three colors, and the laser beams of three colors run through the combining lens group 13, and then exit from the beam outlet 15.

In some embodiments, as shown in FIG. 9, the laser device 12 is fixed on the laser source housing 11 by means of fasteners (e.g., screws), and a laser-exit surface 120 of the laser device 12 is located in the accommodating cavity 14, so as to emit laser beams to the combining lens group 13.

In some embodiments, as shown in FIG. 9, the laser source assembly 10 further includes a converging lens 16. The converging lens 16 is disposed at the beam outlet 15 and is configured to converge the laser beams.

Figure 10A:
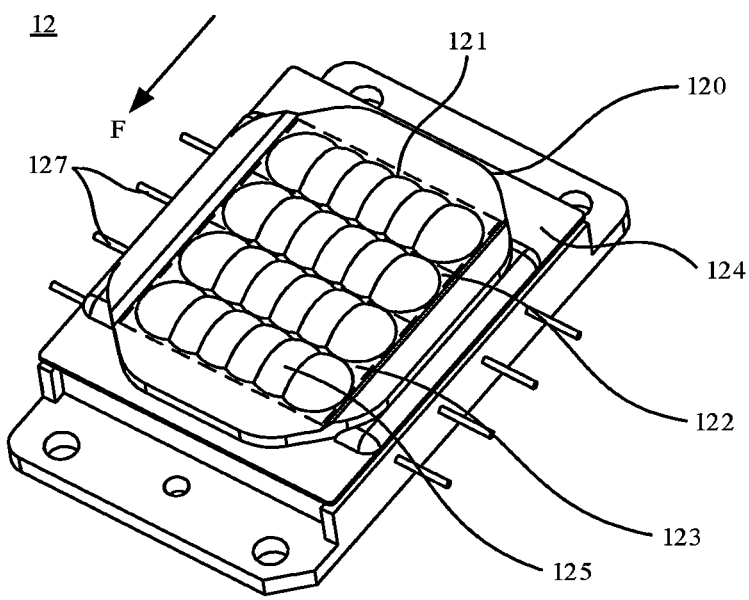
FIG. 10A is a diagram showing a structure of a laser device in a laser source assembly, in accordance with some embodiments.

FIG. 10A is a diagram showing a structure of a laser device in a laser source assembly, in accordance with some embodiments.

In some embodiments, as shown in FIG. 10A, the laser device 12 is a multi-chip laser diode (MCL) device. The laser-exit surface 120 of the laser device 12 includes a first laser-exit region 121, a second laser-exit region 122 and a third laser-exit region 123. In FIG. 10A, for convenience of distinction, each laser-exit region is separated by a dotted line. The first laser-exit region 121, the second laser-exit region 122 and the third laser-exit region 123 may be sequentially arranged along a length direction of the laser device 12 (e.g., the direction F in FIG. 10A). The first laser-exit region 121 is configured to emit laser beams of first color. The second laser-exit region 122 is configured to emit laser beams of second color. The third laser-exit region 123 is configured to emit laser beams of third color. The laser beams of first color, the laser beams of second color, and the laser beams of third color are combined to form white laser beams, and wavelengths of the laser beams of first color, the laser beams of second color, and the laser beams of third color are different from each other.

For example, the laser beams of first color emitted by the first laser-exit region 121 are blue laser beams, the laser beams of second color emitted by the second laser-exit region 122 are green laser beams, and the laser beams of third color emitted by the third laser-exit region 123 are red laser beams.

The present disclosure does not limit the colors of the laser beams of first color, the laser beams of second color and the laser beams of third color, as long as the laser beams of first color, the laser beams of second color and the laser beams of third color may be combined to form the white laser beams.

The following is described by taking an example in which the laser beams of first color are the blue laser beams, the laser beams of second color are the green laser beams, and the laser beams of third color are the red laser beams.

Figure 10B:
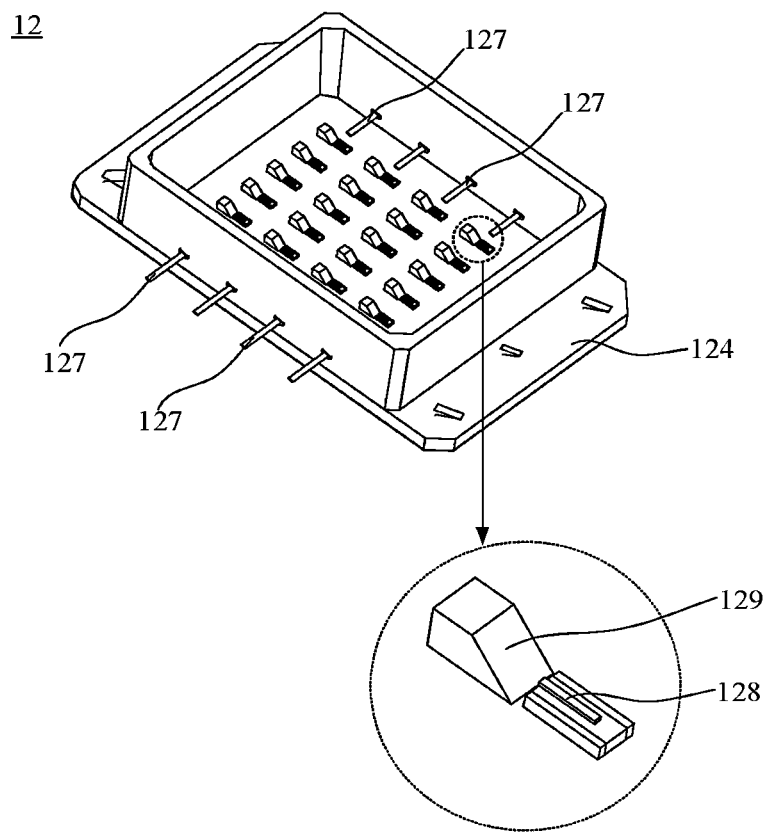
FIG. 10B is a diagram showing another structure of a laser device in a laser source assembly, in accordance with some embodiments.

FIG. 10B is a diagram showing another structure of a laser device in a laser source assembly, in accordance with some embodiments.

In some embodiments, as shown in FIG. 10B, the laser device 12 includes a base 124, a plurality of laser chips 128, and a reflecting portion 129. The plurality of laser chips 128 are configured to emit the laser beams of first color, the laser beams of second color, and the laser beams of third color. The reflecting portion 129 is configured to reflect the laser beams emitted by the plurality of laser chips 128 to the laser-exit surface 120. The plurality of laser chips 128 are arranged in an array and encapsulated on the base 124, and the plurality of laser chips 128 correspond to the above laser-exit regions, respectively.

For example, the plurality of laser chips 128 are arranged in a 4×6 array and encapsulated on the base 124. A row of laser chips 128 corresponds to the first laser-exit region 121 and is used to emit the blue laser beams. A row of laser chips 128 corresponds to the second laser-exit region 122 and is used to emit the green laser beams. Two rows of laser chips 128 correspond to the third laser-exit region 123 and are used to emit the red laser beams. Each row of laser chips 128 includes six laser chips 128. It will be noted that, the plurality of laser chips 128 may also be arranged in a 3×5 array, or a 2×7 array, or a 2×6 array, or other arrays, as long as the laser device 12 may emit the laser beams of three colors.

Through encapsulating the plurality of laser chips 128 on a same laser device 12, it is possible to reduce a volume of the laser device 12, which is conducive to the miniaturization of the laser source assembly 10.

In some embodiments, as shown in FIG. 10A, the laser device 12 further includes a collimating lens group 125. The collimating lens group 125 is disposed at a position of the laser-exit surface 120 of the laser device 12, and is configured to collimate the laser beams incident on the collimating lens group 125.

In some embodiments, the first laser-exit region 121, the second laser-exit region 122 and the third laser-exit region 123 may respectively correspond to one laser chip 128 of the laser device 12, or may correspond to a row of laser chips 128 of the laser device 12, or may correspond to multiple rows of laser chips 128 of the laser device 12.

It will be noted that, FIG. 10A is described by taking an example in which three laser-exit regions are located on a same laser device 12. Of course, the three laser-exit regions each may also be located on different laser devices 12.

Figure 10C:
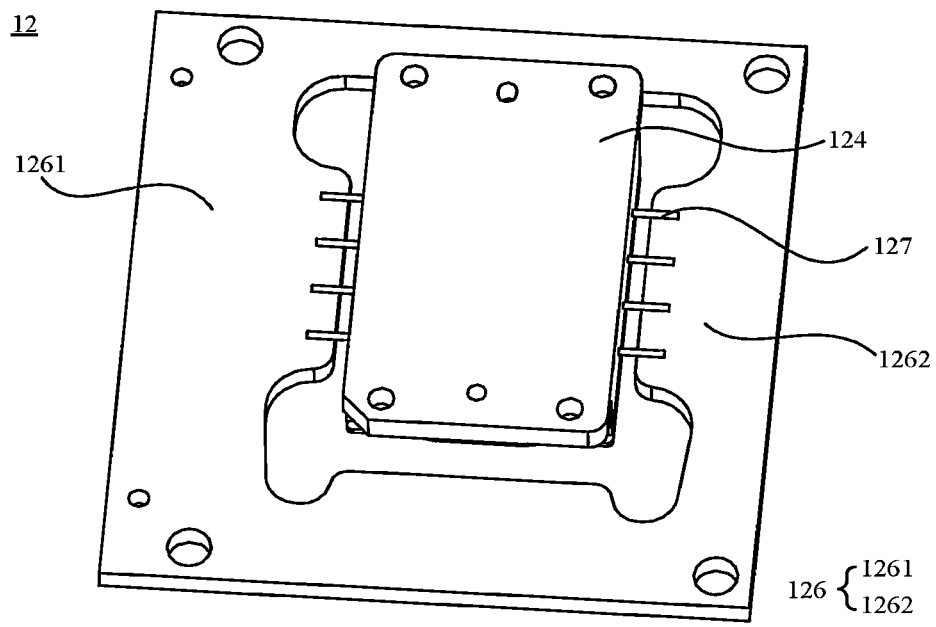
FIG. 10C is a diagram showing a structure of a laser device in a laser source assembly from another perspective, in accordance with some embodiments.

FIG. 10C is a diagram showing a structure of a laser device in a laser source assembly from another perspective, in accordance with some embodiments. FIG. 10C shows another surface (e.g., a back surface) of the laser device 12 in FIG. 10A.

In some embodiments, as shown in FIG. 10C, the laser device 12 further includes a circuit board 126 and a plurality of conductive pins 127. The circuit board 126 is disposed around the laser device 12, and is configured to provide a driving signal for the laser device 12. The plurality of conductive pins 127 are disposed on two sides of the laser device 12 and are electrically connected to the circuit board 126. For example, the plurality of conductive pins 127 are connected to the circuit board 126 by means of welding or plugging. A portion of the conductive pin 127 extending into the laser device 12 is electrically connected to an electrode of the laser chip 128, so as to transmit an external current to the laser chip 128 and excite the laser chip 128 to emit a laser beam.

In some embodiments, as shown in FIG. 10C, the circuit board 126 is in a shape of a flat plate, and the circuit board 126 is substantially parallel to the laser-exit surface 120 of the laser device 12. In this way, the encapsulated laser device 12 is substantially in a shape of a flat plate, which is convenient for installation, saves space, and is conducive to the miniaturization of the laser source assembly 10.

In some embodiments, the circuit board 126 is a one-piece member. Alternatively, the circuit board 126 includes two separate circuit sub-boards. For example, the circuit board 126 includes a first circuit sub-board 1261 and a second circuit sub-board 1262, and the first circuit sub-board 1261 and the second circuit sub-board 1262 are disposed around the laser device 12.

In some embodiments, as shown in FIG. 9, the combining lens group 13 includes a plurality of combining lenses, and the plurality of combining lenses are configured to combine the laser beams of first color, the laser beams of second color, and the laser beams of third color, and emit the laser beams to the beam outlet 15 of the laser source assembly 10. The plurality of combining lenses correspond to different laser-exit regions of the laser device 12 respectively.

As shown in FIG. 9, the combining lens group 13 includes a first combining lens 131, a second combining lens 132 and a third combining lens 133. The first combining lens 131, the second combining lens 132 and the third combining lens 133 each reflect the laser beams emitted by the corresponding laser-exit regions to the beam outlet 15, and the first combining lens 131, the second combining lens 132 and the third combining lens 133 are arranged in sequence along the direction F.

At least one combining lens may transmit the laser beams emitted by other laser-exit regions, and combine these laser beams with the laser beams reflected by the at least one combining lens, so as to emit the combined laser beams to the beam outlet 15. In this way, it is possible to combine the laser beams of different laser-exit regions, so that the laser beams of different colors exit from the beam outlet 15 of the laser device 12 after being combined.

For example, referring to FIG. 9 and FIG. 10A, the first combining lens 131 is located on a laser-exit side of the first laser-exit region 121, and is configured to reflect the laser beams of first color emitted by the first laser-exit region 121 to the second combining lens 132. The second combining lens 132 is located at an intersection of the laser beams of second color emitted by the second laser-exit region 122 and the laser beams of first color reflected by the first combining lens 131, and is configured to reflect the laser beams of second color emitted by the second laser-exit region 122 and transmit the laser beams of first color. The third combining lens 133 is located at an intersection of the laser beams of third color emitted by the third laser-exit region 123 and the laser beams exiting from the second combining lens 132, and is configured to reflect the laser beams of third color emitted by the third laser-exit region 123 and transmit the laser beams of first color and the laser beams of second color.

In this way, the laser beams of third color reflected by the third combining lens 133, and the laser beams of first color and the laser beams of second color transmitted by the third combining lens 133 exit toward the beam outlet 15.

Figure 11:
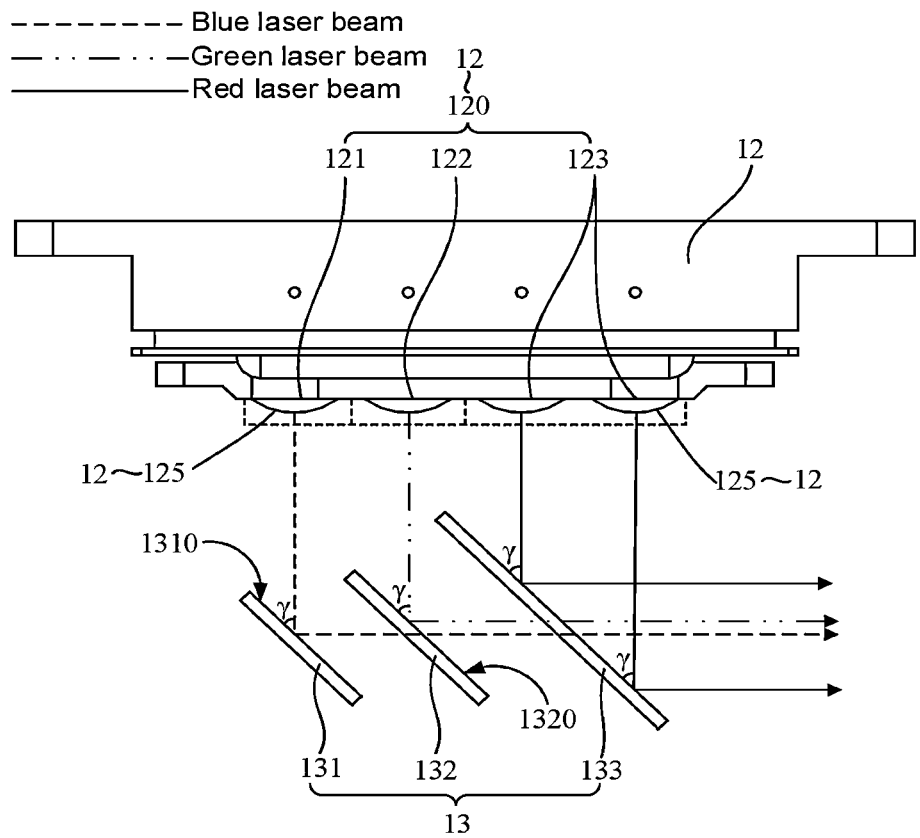
FIG. 11 is a diagram showing a beam path of a laser source assembly in a laser projection apparatus, in accordance with some embodiments.

FIG. 11 is a diagram showing a beam path of a laser source assembly in a laser projection apparatus, in accordance with some embodiments.

In some embodiments, as shown in FIG. 11, the first combining lens 131, the second combining lens 132 and the third combining lens 133 are arranged parallel to each other, and preset included angles γ are provided among the reflecting surfaces of the first combining lens 131, the second combining lens 132 and the third combining lens 133 and the laser beams emitted by the corresponding laser-exit regions, respectively, and each of the preset included angles is any value within a range of 43° to 47° (45°±2°). For example, the preset included angle γ is 43°, 44°, 45°, 46° or 47°. In this way, an included angle between an incident laser beam and a reflected laser beam of the combining lens may be approximately 90°, which facilitates the alignment of beam paths among different combining lenses.

In some embodiments, the first combining lens 131 may be a reflector, and the second combining lens 132 and the third combining lens 133 are dichroic lenses.

In some embodiments, a size of the third combining lens 133 is greater than that of the first combining lens 131 and the second combining lens 132.

The human eyes have different sensitivities to different frequencies of laser beams. The human eyes are more sensitive to the green laser beams and less sensitive to the red and purple laser beams. In the laser projection apparatus 1, a ratio of the red laser beams is larger than that of the green laser beams and the blue laser beams. Therefore, a number of red laser chips in the laser device 12 is greater than a number of other laser chips.

For example, as shown in FIG. 11, in a case where the laser beams of third color are the red laser beams, the third laser-exit region 123 includes two columns or two rows of laser chips 128, and the first laser-exit region 121 and the second laser-exit region 122 each include a column or a row of laser chips 128, respectively. An area of the third laser-exit region 123 is larger than that of the first laser-exit region 121 and the second laser-exit region 122. Therefore, a size of the third combining lens 133 is larger than that of other combining lenses. In this way, the laser beams of third color emitted by the third laser-exit region 123 may all be incident on the third combining lens 133, and the laser beams (e.g., the laser beams of first color and the laser beams of second color) exiting from the second combining lens 132 may all be incident on the third combining lens 133.

Figure 12A:
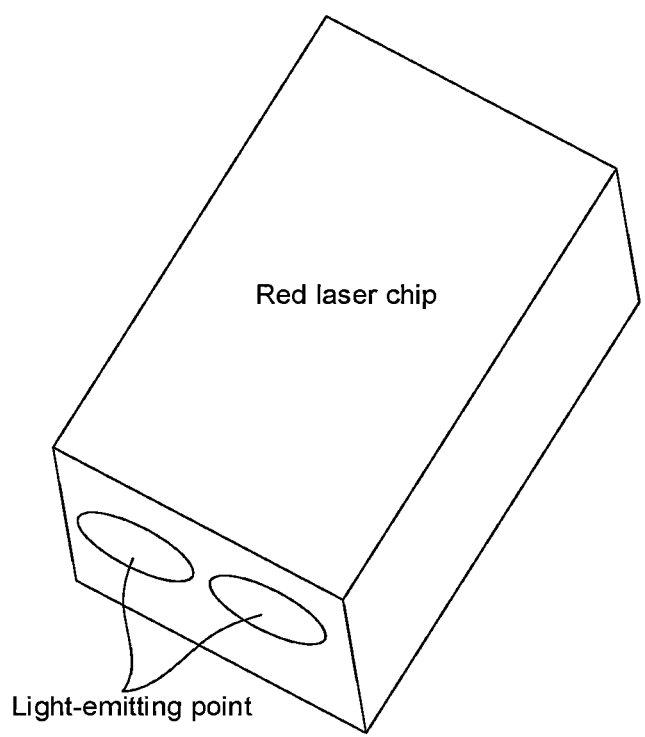
FIG. 12A is a schematic diagram of a red laser chip, in accordance with some embodiments.
Figure 12B:
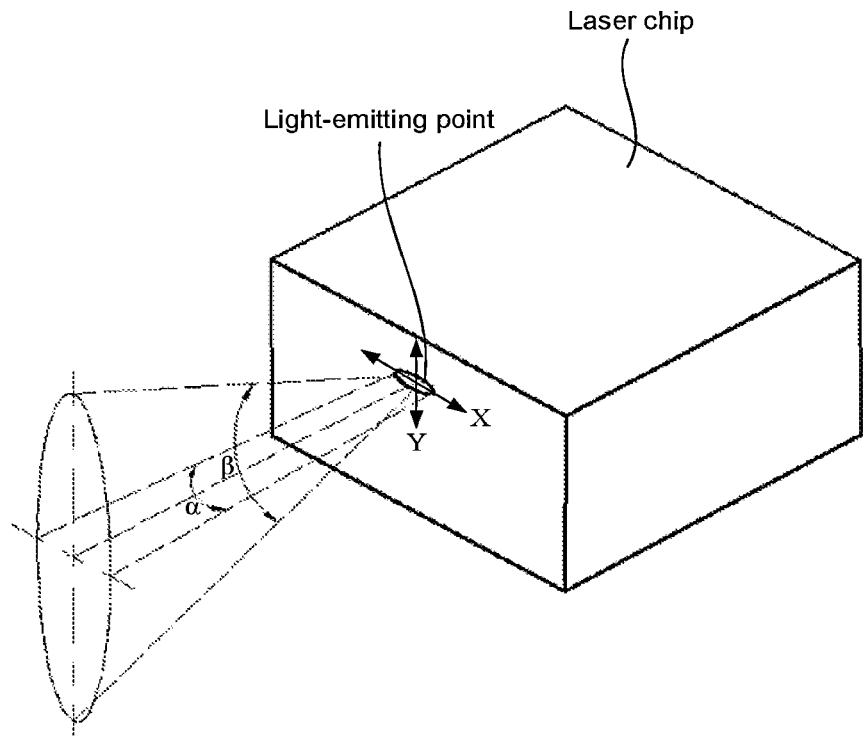
FIG. 12B is a schematic diagram of a laser chip emitting a laser beam, in accordance with some embodiments.

FIG. 12A is a schematic diagram of a red laser chip, in accordance with some embodiments. FIG. 12B is a schematic diagram of a laser chip emitting a laser beam, in accordance with some embodiments.

In the MCL device, different laser chips use different light-emitting materials, and different light-emitting materials have different light-emitting principles. Therefore, light-emitting efficiency of different laser chips is different. Generally, the light-emitting efficiency of the red laser chips is less than that of the green laser chips and the blue laser chips. As shown in FIG. 12A, a red laser chip may include two light-emitting points. As shown in FIG. 12B, a laser beam exits radially from a light-emitting point. A first included angle α and a second included angle β shown in FIG. 12B refer to divergence angles of the laser beam in a slow axis X and a fast axis Y respectively. The divergence speed of the laser beam in the fast axis Y is greater than the divergence speed of the laser beam in the slow axis X, so that the second included angle β is greater than the first included angle α, as a result, a beam spot of the laser beam is in a shape of an ellipse.

Since the red laser chips have a large number of light-emitting points, the divergence angles of the red laser beams emitted by the red laser chips in the fast axis Y and the slow axis X are greater than the divergence angles of the blue laser beams and the green laser beams in the fast axis Y and the slow axis X, which makes a size of the beam spot of the red laser beams be larger than that of the green laser beams and the blue laser beams. Moreover, as a transmission distance of the laser beams increases, the size of the beam spot of the red laser beams increases faster than the sizes of the beam spots of the green laser beams and the blue laser beams. Even if laser beams obtained by combining the laser beams of three primary colors are homogenized and contracted in the subsequent beam path, the size of the beam spot of the red laser beams is still larger than that of the laser beams of other two colors, resulting in poor coincidence of the beam spots after the laser beams of three primary colors are combined.

In the optical engine 20, the coincidence of the beam spots of the laser beams of three primary colors after being combined may be improved by increasing a length of the light pipe 210 or by increasing a divergence angle of the laser beams through the diffusion sheet. However, a long light pipe 210 may cause the entire optical system long, which is not conducive to the miniaturization of the laser projection apparatus 1. Moreover, the manner of increasing the divergence angles of the laser beams through the diffusion sheet is prone to make the divergence angles of the laser beams large, resulting in the loss of some of the laser beams and affecting the utilization rate of the laser beams.

In the laser source assembly 10, the coincidence of the beam spots of the laser beams of three primary colors after being combined may be improved by providing a diffractive optical element (DOE) or a polarization beam splitting system in the laser projection apparatus 1. However, the diffractive optical element needs to be prepared by a micro-nano etching process, and the production process is complicated and the cost is high. The polarization beam splitting system has a number of optical lenses and a beam path thereof is long, which is not conducive to the miniaturization of the laser projection apparatus 1. Moreover, there are many optical elements in the above two manners, which increases the complexity of the optical system, an accumulative error of the beam path, and the loss of the laser beams during propagation.

In order to solve the above problems, in some embodiments of the present disclosure, a combining lens group 13 is provided. The combining lens group 13 further includes a beam spot adjustment structure 130. The beam spot adjustment structure 130 is disposed in beam paths of the laser beams of first color and the laser beams of second color before being combined with the laser beams of third color, and the beam spot adjustment structure 130 is configured to increase a divergence angle of at least one of the laser beams of first color or the laser beams of second color. The laser beams exiting from the beam outlet of the laser source assembly 10 constitutes the illumination beams.

Figure 13A:
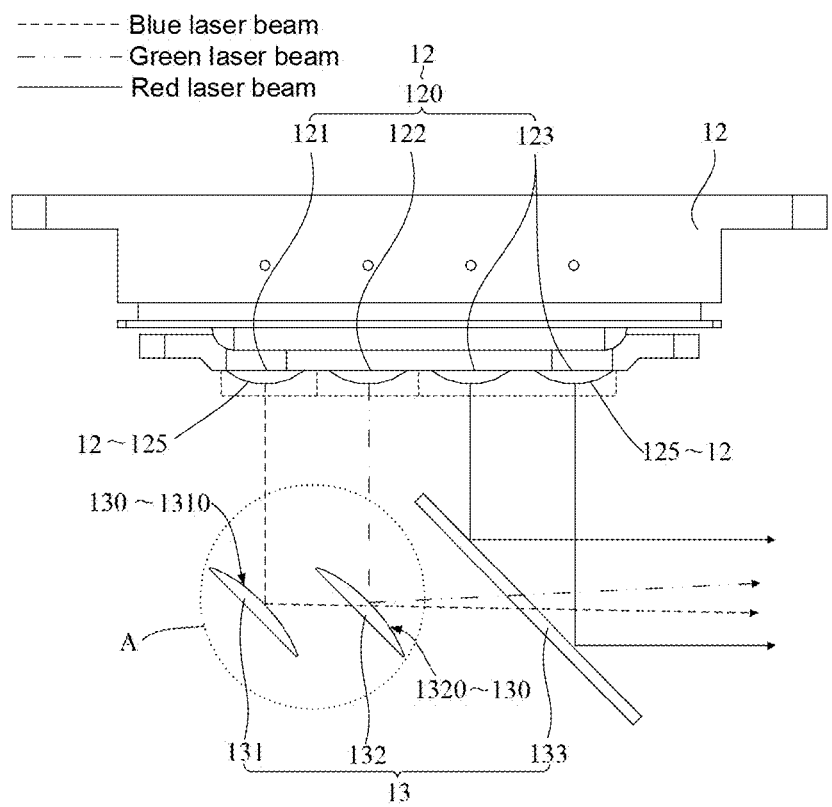
FIG. 13A is a diagram showing another beam path of a laser source assembly in a laser projection apparatus, in accordance with some embodiments.
Figure 13B:
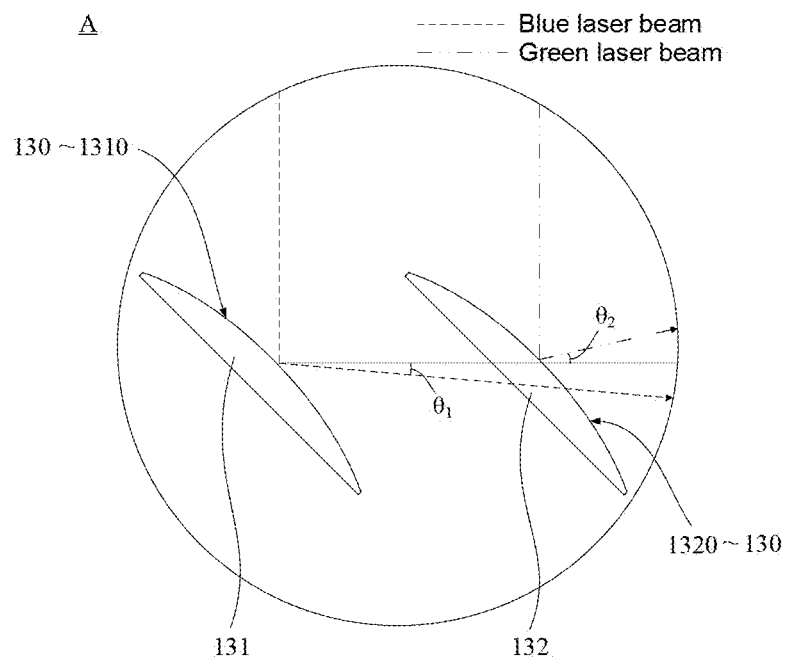
FIG. 13B is a partial enlarged view of the circle A in FIG. 13A.

FIG. 13A is a diagram showing another beam path of a laser source assembly in a laser projection apparatus, in accordance with some embodiments. FIG. 13B is a partial enlarged view of the circle A in FIG. 13A.

In some embodiments, a reflecting surface of at least one of the first combining lens 131 of the combining lens group 13 or the second combining lens 132 of the combining lens group 13 is a convex surface, the convex surface protrudes toward the corresponding laser-exit region, and the beam spot adjustment structure 130 includes the convex surface. As shown in FIG. 13A, the first combining lens 131 of the combining lens group 13 includes a first reflecting surface 1310, and the first reflecting surface 1310 is a surface of the first combining lens 131 opposite to the first laser-exit region 121. The second combining lens 132 of the combining lens group 13 includes a second reflecting surface 1320, and the second reflecting surface 1320 is a surface of the second combining lens 132 opposite to the second laser-exit region 122. The first reflecting surface 1310 and the second reflecting surface 1320 are convex surfaces (e.g., cylindrical convex surfaces), and the first reflecting surface 1310 and the second reflecting surface 1320 each protrude toward the corresponding laser-exit region. Moreover, the convex surfaces each have a divergence effect on incident laser beams when they are used as reflecting surfaces. The first reflecting surface 1310 is configured to reflect and disperse the laser beams of first color emitted by the first laser-exit region 121. The second reflecting surface 1320 is configured to reflect and disperse the laser beams of second color emitted by the second laser-exit region 122.

For example, since the laser beams of first color and the laser beams of second color are collimated by the collimating lens group 125 and then exit from the laser device 12, the laser beams of first color and the laser beams of second color are substantially parallel beams. In this way, as shown in FIG. 13B, after the laser beams of first color are reflected and diverged by the first combining lens 131, the divergence angle of the first color laser beams is increased by a first angle $\theta_1$, and a beam spot of the laser beams of first color is located within a beam spot of the laser beams of third color. After the laser beams of second color are reflected and diverged by the second combining lens 132, the divergence angle of the laser beams of second color is increased by a second angle $\theta_2$, and a beam spot of the laser beams of second color is located within a beam spot of the laser beams of third color.

In some embodiments, the first angle $\theta_1$ and the second angle $\theta_2$ are any value within a range of 2° to 8° inclusive. For example, the first angle $\theta_1$ and the second angle $\theta_2$ each are 2°, 3°, 4°, 5°, 6°, 7°, or 8°. In this way, the divergence angle of the laser beams of third color is unchanged, and by increasing the divergence angles of the laser beams of first color and the laser beams of second color, it is possible to reduce a difference between the divergence angle of the laser beams of first color (or the laser beams of second color) and the divergence angle of the laser beams of third color, and to avoid a case where the beam spot of the laser beams of first color or the laser beams of second color is beyond the beam spot of the laser beams of third color due to excessive divergence angle.

It will be noted that, the beam spot in some embodiments of the present disclosure may be a beam spot at a beam inlet surface of the light pipe 210. In addition, in a case where the second combining lens 132 includes a dichroic lens, the second reflecting surface 1320 is a coating film on a surface of the dichroic lens.

Through providing the first reflecting surface 1310 and the second reflecting surface 1320 as the convex surfaces, it is possible to increase the divergence angles of the laser beams of first color and the laser beams of second color. In this way, the divergence angles of the laser beams of first color and the laser beams of second color incident on the third combining lens 133 are substantially same as the divergence angle of the laser beams of third color. Moreover, the beam spots of the laser beams of first color and the laser beams of second color are located within the beam spot of the laser beams of third color, and sizes of the beam spots of the laser beams of first color and the laser beams of second color are same as that of the laser beams of third color, which improves a color boundary phenomenon of the beam spot of the combined laser beams, the coincidence of the beam spot, and the uniformity of the color and luminance of the beam spot.

Moreover, there is no need to provide a lot of optical elements, which reduces the complexity of the optical system and the accumulative error of the beam path, reduces the loss of the laser beams in the propagation process, and is conducive to the miniaturization of the laser projection apparatus 1.

It will be noted that, the color boundary phenomenon of the beam spot is as follows. As shown in FIG. 11, in a case where the first reflecting surface 1310 and the second reflecting surface 1320 are planes, the divergence angles of the laser beams of first color and the laser beams of second color reflected by the corresponding combining lens are substantially equal to the divergence angles of the laser beams of first color and the laser beams of second color exiting from the laser device 12, respectively. In this case, after the laser beams of three colors are combined by the third combining lens 133, the beam spot of the combined laser beams appears an obvious boundary among the laser beams of three colors.

For example, the beam spot of the combined laser beams is approximately in a shape of a circle, and an outer ring of the beam spot appears red. Along a direction from the outside to the inside, the color of the beam spot appears different colors such as purple, blue, and yellow in sequence. In this case, the color of the beam spot formed by the laser beams of three colors after being combined is not uniform.

Figure 14A:
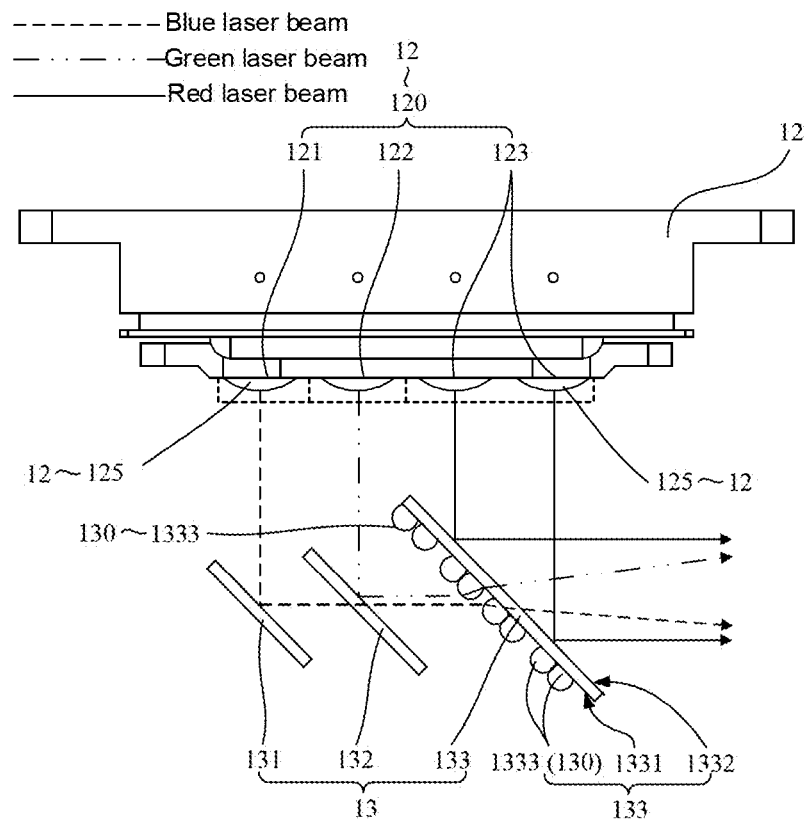
FIG. 14A is a diagram showing yet another beam path of a laser source assembly in a laser projection apparatus, in accordance with some embodiments.
Figure 14B:
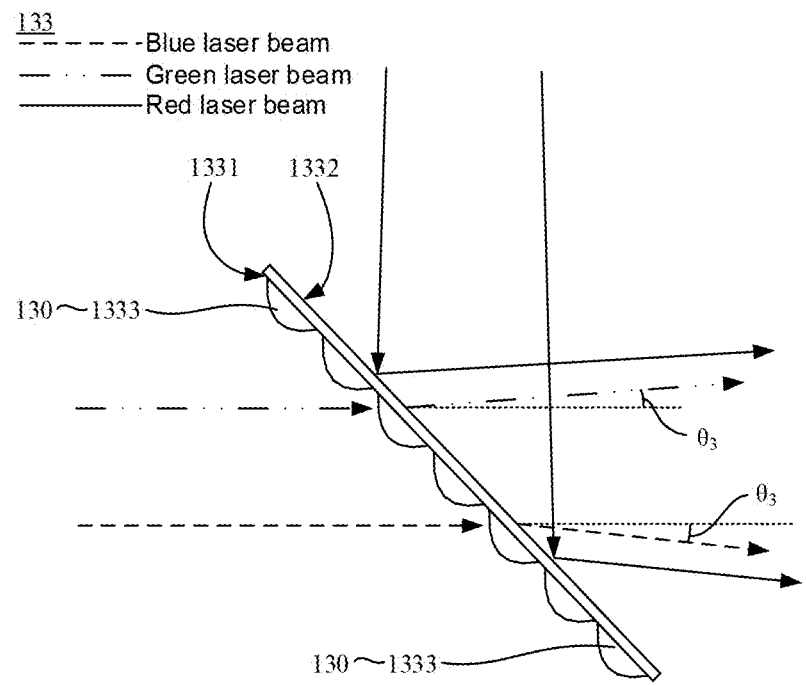
FIG. 14B is a diagram showing a structure of a third combining lens in a combining lens group, in accordance with some embodiments.

FIG. 14A is a diagram showing yet another beam path of a laser source assembly in a laser projection apparatus, in accordance with some embodiments. FIG. 14B is a diagram showing a structure of a third combining lens in a combining lens group, in accordance with some embodiments.

Of course, the present disclosure is not limited to the case where the first reflecting surface 1310 and the second reflecting surface 1320 are provided as convex surfaces. In some embodiments, as shown in FIGS. 14A and 14B, the first reflecting surface 1310 and the second reflecting surface 1320 are planes, and the third combining lens 133 includes a first surface 1331, a second surface 1332 and convex structures 1333. And the beam spot adjustment structure 130 includes the convex structures 1333. In this way, it is possible to improve the coincidence of the beam spots of the laser beams after being combined through adjusting a structure of the third combining lens 133.

The first surface 1331 is a surface of the third combining lens 133 proximate to the second combining lens 132, and the second surface 1332 is a surface of the third combining lens 133 away from the second combining lens 132. The first surface 1331 is a beam incident surface of the third combining lens 133 corresponding to the laser beams exiting from the second combining lens 132. The second surface 1332 is a reflecting surface of the third combining lens 133 corresponding to the laser beams of third color emitted from the third laser-exit region 123, so as to reflect the laser beams of third color to the beam outlet 15.

The convex structures 1333 are disposed on the first surface 1331 and protrude towards the second combining lens 132. The convex structures 1333 are configured to diverge the laser beams of first color and the laser beams of second color.

By providing the convex structures 1333 on the first surface 1331, the first surface 1331 may be turned into a rough surface. In this way, the laser beams of first color and the laser beams of second color are diffused or scattered when passing through the convex structures 1333, so that the divergence angles of the laser beams of first color and the laser beams of second color are increased.

For example, since the first reflecting surface 1310 and the second reflecting surface 1320 are planes, after the laser beams of first color and the laser beams of second color, which are substantially parallel beams, are reflected by the corresponding reflecting surface, they are still parallel or approximately parallel laser beams. After the laser beams of first color and the laser beams of second color pass through the convex structures 1333, the divergence angles of the laser beams of first color and the laser beams of second color each are increased by a third angle $\theta_3$ (as shown in FIG. 14B), and the beam spots of the laser beams of first color and the laser beams of second color after being diverged are located within the beam spot of the laser beams of third color. It will be noted that, the increased divergence angle of the laser beams of first color and the increased divergence angle of the laser beams of second color may be same or different.

In some embodiments, a range of the third angle $\theta_3$ is same as that of the first angle 81 and the second angle $\theta_2$. The third angle $\theta_3$ plays a same role as the first angle $\theta_1$ and the second angle $\theta_2$, which will not be repeated herein.

In some embodiments, the convex structures 1333 may be randomly distributed and granular with irregular particle size. In this way, the divergence angles of the laser beams of first color and the laser beams of second color passing through the convex structures 1333 may exhibit randomness.

In some embodiments, the convex structures 1333 may be regularly arranged. For example, the convex structures 1333 are arranged in an array.

Through providing the convex structures 1333, it is possible to increase the divergence angles of the laser beams of first color and the laser beams of second color passing through the convex structures 1333 and the third combining lens 133, and to improve the coincidence of the beam spots of the laser beams of first color and the laser beams of second color and the beam spot of the laser beams of third color.

Moreover, compared with the manner that the reflecting surfaces of the first combining lens 131 and the second combining lens 132 are convex surfaces, in the manner of providing the convex structures 1333 on the third combining lens 133, only the structure and position of a single combining lens need to be adjusted, which reduces the cost, and facilitates the alignment of beam paths among different combining lenses when installing the combining lens group 13.

Figure 15A:
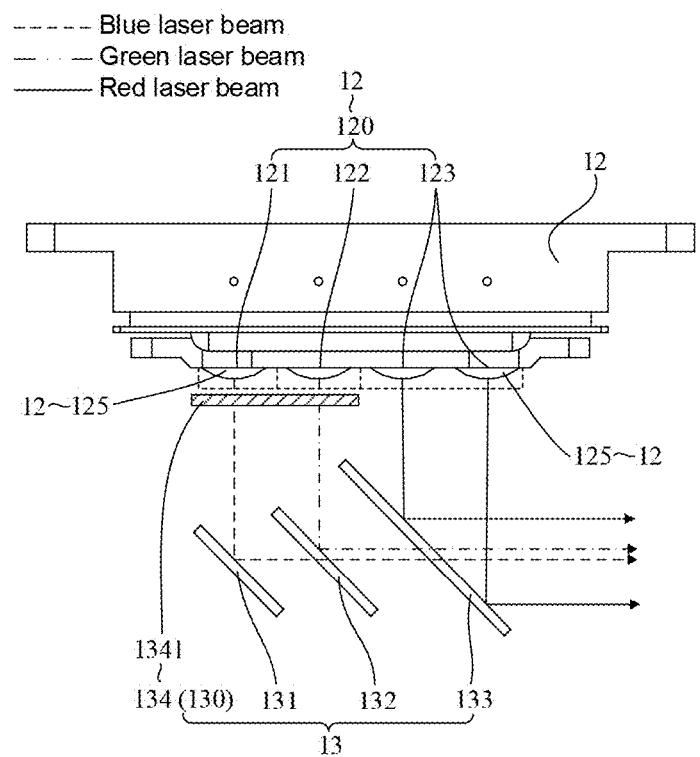
FIG. 15A is a diagram showing yet another beam path of a laser source assembly in a laser projection apparatus, in accordance with some embodiments.
Figure 15B:
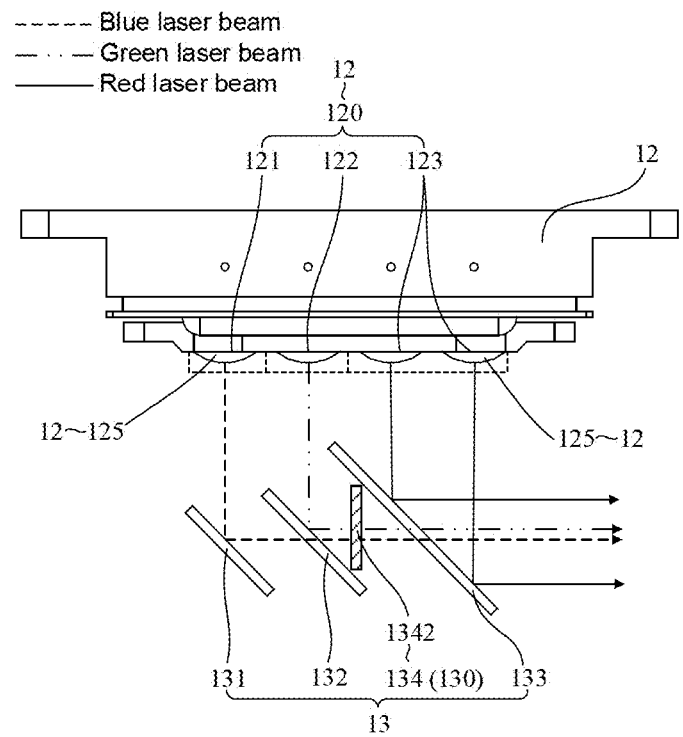
FIG. 15B is a diagram showing yet another beam path of a laser source assembly in a laser projection apparatus, in accordance with some embodiments.

FIG. 15A is a diagram showing yet another beam path of a laser source assembly in a laser projection apparatus, in accordance with some embodiments. FIG. 15B is a diagram showing yet another beam path of a laser source assembly in a laser projection apparatus, in accordance with some embodiments.

Of course, the present disclosure is not limited to the case where the first reflecting surface 1310 and the second reflecting surface 1320 are provided as convex surfaces, or the third light combining lens 133 is provided as including the convex structure 1333. In some embodiments, as shown in FIGS. 15A and 15B, the combining lens group 13 includes a beam expanding component 134. The beam expanding component 134 is located in beam paths of the laser beams of first color and the laser beams of second color before being combined with the laser beams of third color. The beam expanding component 134 is configured to diverge the incident laser beams, so as to increase the divergence angle of the laser beams. And the beam spot adjustment structure 130 includes the beam expanding component 134. For example, the convex structures 1333 are disposed on at least one of the two opposite surfaces of the beam expanding component 134, so as to increase the divergence angle of the laser beams passing through the beam expanding component 134. Alternatively, the beam expanding component 134 includes a diffusion sheet.

In some embodiments, as shown in FIG. 15A, the beam expanding component 134 includes a first beam expanding component 1341. The first beam expanding component 1341 is disposed on the laser-exit sides of the first laser-exit region 121 and the second laser-exit region 122 and is parallel to the laser-exit surface 120. The first beam expanding component 1341 is located in the beam path of the laser beams of first color before being incident on the first combining lens 131 and the beam path of the laser beams of second color before being incident on the second combining lens 132, so as to increase the divergence angles of the laser beams of first color and the laser beams of second color.

In some embodiments, as shown in FIG. 15B, the beam expanding component 134 includes a second beam expanding component 1342, and the second beam expanding component 1342 is disposed between the second combining lens 132 and the third combining lens 133, so as to increase the divergence angles of the laser beams of first color and the laser beams of second color exiting from the second combining lens 132. Since a size of the beam spot of the laser beams combined by the second combining lens 132 is small, a size of the second beam expanding component 1342 in FIG. 15B may be smaller than that of the first beam expanding component 1341 in FIG. 15A, which reduces the cost. Moreover, there is no need to additionally provide a position for installing the second beam expanding component 1342, so that the beam path is compact, which is conducive to the miniaturization of the laser projection apparatus 1.

It will be noted that, compared with the second beam expanding component 1342 disposed between the second combining lens 132 and the third combining lens 133, an optical path length of the laser beams diverged by the first beam expanding component 1341 which are incident on the third combining lens 133 is longer. Therefore, the increased divergence angle of the laser beams diverged by the first beam expanding component 1341 is required to be less than the increased divergence angle of the laser beams diverged by the second beam expanding component 1342, so that the beam spots of the laser beams of first color and the laser beams of second color after they running along a beam path for a certain distance may be located within the beam spot of the laser beams of third color.

In some embodiments, the beam expanding component 134 may be a one-piece member. Alternatively, the beam expanding component 134 includes two separate parts. For example, the beam expanding component 134 includes one diffusion sheet. Alternatively, the beam expanding component 134 includes two diffusion sheets, and the two diffusion sheets correspond to the first laser-exit region 121 and the second laser-exit region 122 respectively.

In some embodiments of the present disclosure, through providing the beam expanding component 134, it is possible to increase the divergence angles of the laser beams of first color and the laser beams of second color before being combined with the laser beams of third color, which improves the coincidence of the beam spots of the combined laser beams.

Moreover, there is no need to provide the convex structures 1333 on the third combining lens 133, thereby reducing the difficulty of manufacturing process.

In some embodiments, the third combining lens 133 is disposed proximate to the beam outlet 15, the third laser-exit region 123 emits two groups laser beams of third color, the first laser-exit region 121 emits one group of laser beams of first color, and the second laser-exit region 121 emits one group of laser beams of second color. Moreover, positions of the third combining lens 133 on which the laser beams of first color and the laser beams of second color are incident are located between positions of the third combining lens 133 on which the two groups of laser beams of third color are incident.

Since the divergence angles of the laser beams of the three colors are different, parallelisms of the laser beams of the three colors after being collimated by the collimating lens group 125 are different. For example, parallelisms of the blue laser beams and the green laser beams are approximately same, and a parallelism of the red laser beams after being collimated by the collimating lens group 125 is greater than that of the blue laser beams and the green laser beams due to the large divergence angle of the red laser beams. The greater the parallelism, the worse the effect of the collimation.

In this way, in a case where the laser beams of third color include two groups of laser beams, the size of the beam spot of the laser beams of third color is greater than that of the laser beams of first color and the laser beams of second color. In this case, by making the positions of the third combining lens 133 on which the laser beams of first color and the laser beams of second color are incident be located within the positions of the third combining lens 133 on which the two groups of laser beams of third color are incident, it is possible to make the size of the beam spot of the combined laser beams be approximately same as the size of the beam spot of the laser beams of third color, which is conducive to contracting the size of the beam spot of the combined laser beams.

In some embodiments, the laser beams of first color, the laser beams of second color, and the laser beams of third color are linearly polarized light. Moreover, polarization directions of the laser beams of first color and the laser beams of second color are same, and the polarization directions of the laser beams of first color and the laser beams of second color are perpendicular to a polarization direction of the laser beams of third color. For example, the laser beams of first color are the blue laser beams, the laser beams of second color are the green laser beams, the laser beams of third color are the red laser beams, the blue laser beams and the green laser beams are S-polarized light, and the red laser beams are P-polarized light, the P-polarized light is perpendicular to the S-polarized light.

Figure 16A:
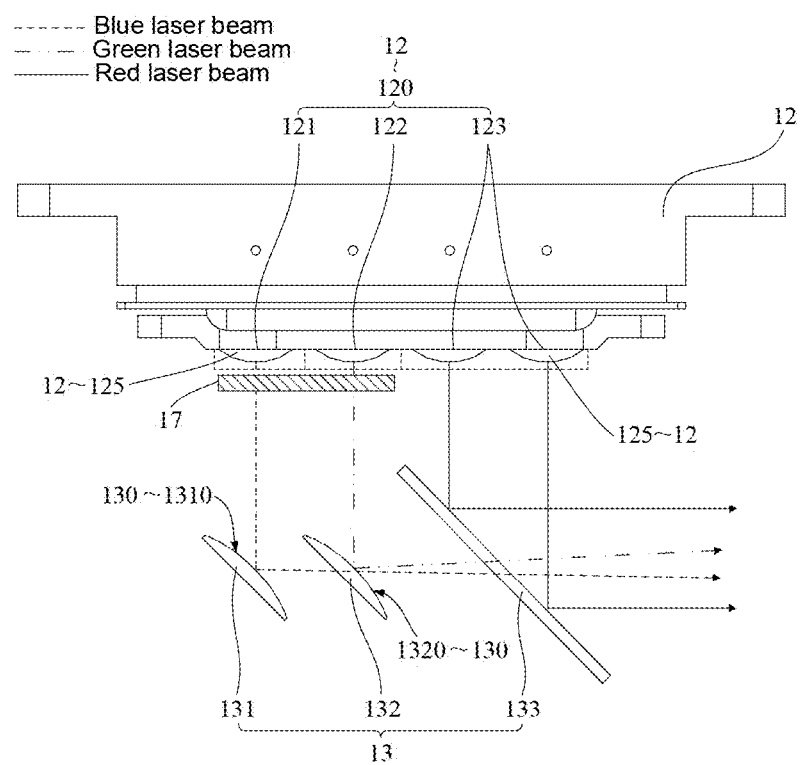
FIG. 16A is a diagram showing yet another beam path of a laser source assembly in a laser projection apparatus, in accordance with some embodiments.
Figure 16B:
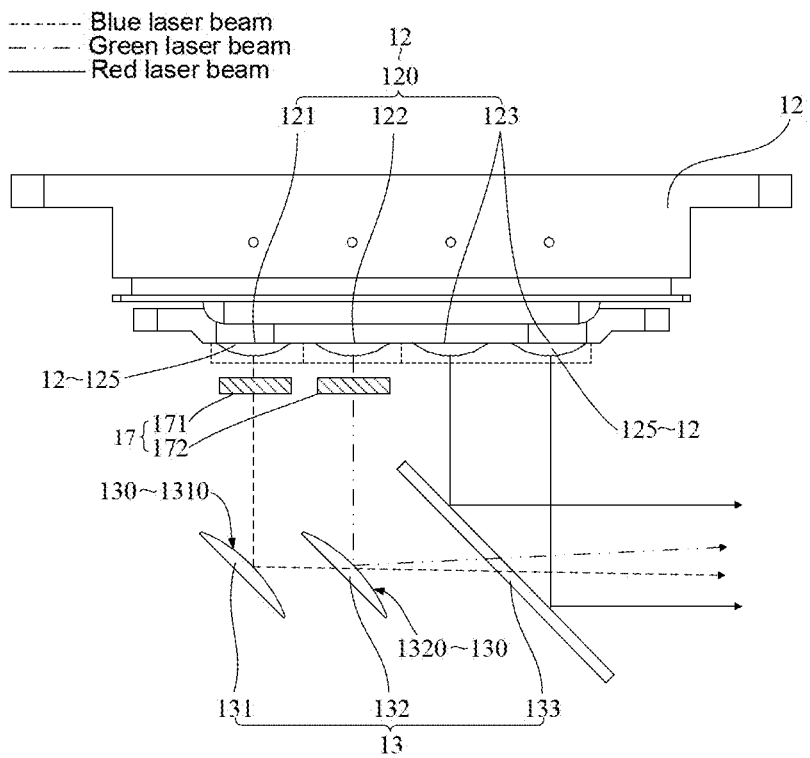
FIG. 16B is a diagram showing yet another beam path of a laser source assembly in a laser projection apparatus, in accordance with some embodiments.

FIG. 16A is a diagram showing yet another beam path of a laser source assembly in a laser projection apparatus, in accordance with some embodiments. FIG. 16B is a diagram showing yet another beam path of a laser source assembly in a laser projection apparatus, in accordance with some embodiments.

In some embodiments, as shown in FIGS. 16A and 16B, the laser source assembly 10 further includes a phase retarder 17. The phase retarder 17 is located in the beam paths of the laser beams of first color and the laser beams of second color before being combined with the laser beams of third color. The phase retarder 17 is configured to change a polarization direction of the laser beams incident on the phase retarder 17.

In some embodiments, as shown in FIGS. 16A and 16B, the phase retarder 17 is disposed on the laser-exit sides of the first laser-exit region 121 and the second laser-exit region 122. In this way, the laser beams emitted by the first laser-exit region 121 and the second laser-exit region 122 may be incident on the corresponding combining lens after passing through the phase retarder 17.

For example, the phase retarder 17 is disposed parallel to the laser-exit surface 120 and fixed in the laser source housing 11 by means of clamping. An orthogonal projection of the phase retarder 17 on the laser-exit surface 120 covers the first laser-exit region 121 and the second laser-exit region 122 of the laser-exit surface 120, so that the phase retarder 17 may receive all the laser beams emitted by the first laser-exit region 121 and the second laser-exit region 122.

It will be noted that, generally, a phase retarder 17 only corresponds to a wavelength of laser beams of one color, and the phase retarder 17 changes phases of the transmitted laser beams through adjusting a growth thickness of crystals. In some embodiments of the present disclosure, the phase retarder 17 includes a half-wave plate. The half-wave plate may change the phase of the laser beams of corresponding color by Tr, so as to change the polarization direction of the laser beams by 90°. For example, the half-wave plate converts the P-polarized light into the S-polarized light. Alternatively, the half-wave plate converts the S-polarized light into the P-polarized light.

In some embodiments, as shown in FIG. 16A, the phase retarder 17 includes one half-wave plate, and corresponds to the wavelength of the blue laser beams. In this way, the polarization direction of the blue laser beams is changed by 90° after passing through the phase retarder 17, and is converted from the S-polarized light into the P-polarized light. After the green laser beams pass through the phase retarder 17, since the phase retarder 17 does not correspond to the wavelength of the green laser beams, the angle at which the polarization direction of the green laser beams changes is not 90°, but the polarization direction of the green laser beams converted by the phase retarder 17 is approximate to the polarization direction of the P-polarized light. Of course, the phase retarder 17 may also correspond to the wavelength of the green laser beams. In this case, the polarization direction of the green laser beams is changed by 90° after passing through the phase retarder 17, and is converted from the S-polarized light into the P-polarized light, and the angle of the polarization direction of the blue laser beams is changed approximately by 90° after the blue laser beams are converted by the phase retarder 17.

In some embodiments, as shown in FIG. 16B, the phase retarder 17 includes two half-wave plates, and the two half-wave plates include a first phase sub-retarder 171 and a second phase sub-retarder 172 respectively. The two phase retarders 17 correspond to the wavelengths of the green laser beams and the blue laser beams respectively, so that the polarization directions of the green laser beams and the blue laser beams each may be changed by 90°, and the laser beams of the two colors (e.g., the green laser beams and the blue laser beams) each may be converted into the P-polarized light.

For example, the first phase sub-retarder 171 is disposed in the beam path of the blue laser beams before being incident on the first combining lens 131, and the second phase sub-retarder 172 is disposed in the beam path of the green laser beams before being incident on the second combining lens 132. The two phase retarders 17 each correspond to the laser beams of one color, which may improve the accuracy of the phase delay of the laser beams, and accurately obtain the green P-polarized light and the blue P-polarized light.

Of course, in some embodiments, the phase retarder 17 may also include one half-wave plate, and the half-wave plate includes two coating regions. The two coating regions correspond to the first laser-exit region 121 and the second laser-exit region 122 respectively, and correspond to the wavelengths of the green laser beams and the blue laser beams respectively. In this way, the polarization directions of the laser beams of the two colors may be accurately changed by the one half-wave plate, which is conducive to simplify the structure of the laser source assembly 10.

In some embodiments, the phase retarder 17 may also be disposed in the beam paths of the laser beams of first color and the laser beams of second color before being combined with the laser beams of third color. For example, the phase retarder 17 is disposed between the second combining lens 132 and the third combining lens 133, and the phase retarder 17 transmits the laser beams of first color and the laser beams of second color exiting from the second combining lens 132. In this case, the phase retarder 17 does not distinguish the coating regions, and is only coated with a coating film corresponding to the wavelength of one color. Moreover, the size of the beam spot of the laser beams combined by the second combining lens 132 is small, which is conducive to reducing the size of the phase retarder 17 and reducing the cost.

Figure 16C:
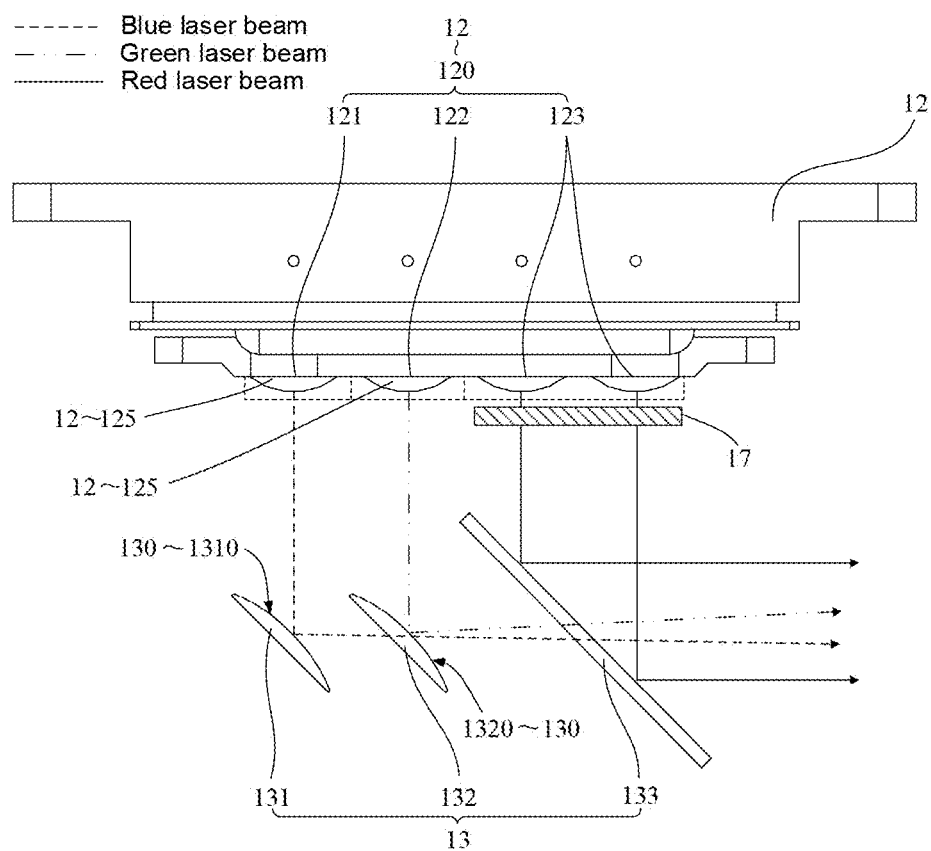
FIG. 16C is a diagram showing yet another beam path of a laser source assembly in a laser projection apparatus, in accordance with some embodiments.

FIG. 16C is a diagram showing yet another beam path of a laser source assembly in a laser projection apparatus, in accordance with some embodiments.

In some embodiments, as shown in FIG. 16C, the phase retarder 17 is disposed on a laser-exit side of the third laser-exit region 123, and is located in the beam path of the laser beams of third color before being combined with the laser beams of first color and the laser beams of second color. For example, the phase retarder 17 is disposed between the third laser-exit region 123 and the third combining lens 133.

In this case, the phase retarder 17 corresponds to the wavelength of the laser beams of third color. For example, in a case where the laser beams of third color are the red laser beams and are the P-polarized light, the polarization direction of the red laser beams may be changed by 90° after passing through the phase retarder 17, so as to convert the red laser beams from the P-polarized light into the S-polarized light. In this way, only one phase retarder 17 may make the polarization directions of the laser beams of first color, the laser beams of second color and the laser beams of third color same, which is conducive to simplifying the structure of the laser source assembly 10.

The above description is mainly described by taking an example in which the reflecting surfaces of the first combining lens 131 and the second combining lens 132 are convex surfaces. Of course, in a case where the third combining lens 133 includes the convex structures 1333, the arrangement of the phase retarder 17 is same as the above, and details will not be repeated herein.

The transmittance of the P-polarized light and the S-polarized light of a same optical lens is different. Herein, the optical lens not only includes the optical lenses (e.g., the collimating lens group 125, the combining lens group 13, or the converging lens 16) in the laser source assembly 10, but also includes the optical lenses in the illumination path in the optical engine 20, the optical lenses in the projection lens 30 and the screen for projection. Therefore, after the laser beams emitted by the laser device 12 pass through the entire optical system, a difference between the transmittance of the P-polarized light and the S-polarized light is significant.

For example, the optical lens has a higher transmittance for the P-polarized light than that for the S-polarized light. Therefore, compared with the S-polarized light, more of the P-polarized light emitted by the laser device 12 may be incident on the screen and be reflected into the human eyes. In this way, it is prone to have a local color cast problem (e.g., part of the projected image being reddish) on the projected image, so that the actual displayed color is different from the desired displayed color, the local chromaticity of the projected image is not uniform, and the quality of the projected image is low.

In some embodiments of the present disclosure, by providing the phase retarder 17 in the beam paths of the laser beams of first color and the laser beams of second color, it is possible to change the polarization directions of the laser beams of first color and the laser beams of second color, so as to make the polarization directions of the laser beams of first color and the laser beams of second color same as the polarization direction of the laser beams of third color. In this way, during a process of the laser beams of different colors entering the human eyes through the optical system of the laser projection apparatus 1 and the screen, a difference between the transmittance of the laser beams of different colors is reduced, and the loss of the laser beams in the laser projection apparatus 1 is reduced, the uniformity of chromaticity and luminance of the projected image is improved, and the display quality of the projected image is improved.

Moreover, the transmittance of the optical lens for the P-polarized light is generally greater than the transmittance for the S-polarized light. Therefore, by converting the laser beams of first color and the laser beams of second color, which are the S-polarized light, into the P-polarized light, it is possible to improve the beam transmission efficiency of the laser projection apparatus 1, and to improve the luminance of the entire projected image and the quality of the projected image.

A person skilled in the art will understand that, the scope of disclosure in the present disclosure is not limited to specific embodiments discussed above, and may modify and substitute some elements of the embodiments without departing from the spirits of this application. The scope of this application is limited by the appended claims.

What is claimed is:
1. A laser projection apparatus, comprising:
a laser source assembly configured to emit illumination beams;
an optical engine configured to modulate the illumination beams emitted by the laser source assembly, so as to obtain projection beams; and
a projection lens configured to project the projection beams into an image;
the laser source assembly including:
a laser device, the laser device including:
a first laser-exit region emitting laser beams of first color;
a second laser-exit region emitting laser beams of second color; and
a third laser-exit region emitting laser beams of third color; and
a combining lens group, the combining lens group including:
a plurality of combining lenses corresponding to the first laser-exit region, the second laser-exit region and the third laser-exit region respectively, the plurality of combining lenses being configured to combine the laser beams of first color, the laser beams of second color and the laser beams of third color, and emit the combined laser beams to a beam outlet of the laser source assembly; and a beam spot adjustment structure disposed in beam paths of the laser beams of first color and the laser beams of second color before being combined with the laser beams of third color, the beam spot adjustment structure being configured to increase a divergence angle of at least one of the laser beams of first color or the laser beams of second color; wherein the laser beams exiting from the beam outlet of the laser source assembly constitutes the illumination beams.

2. The laser projection apparatus according to claim 1, wherein the combining lens group includes:
a first combining lens located on a laser-exit side of the first laser-exit region, the first combining lens being configured to reflect the laser beams of first color emitted by the first laser-exit region;
a second combining lens located at an intersection of the laser beams of second color emitted by the second laser-exit region and the laser beams of first color reflected by the first combining lens, the second combining lens being configured to reflect the laser beams of second color and transmit the laser beams of first color; and
a third combining lens located at an intersection of the laser beams of third color emitted by the third laser-exit region and laser beams exiting from the second combining lens, the third combining lens being configured to reflect the laser beams of third color and transmit the laser beams of first color and the laser beams of second color.

3. The laser projection apparatus according to claim 2, wherein a reflecting surface of at least one of the first combining lens or the second combining lens is a convex surface, and the convex surface protrudes toward the corresponding laser-exit region; and
the beam spot adjustment structure includes the convex surface.

4. The laser projection apparatus according to claim 3, wherein
the first combining lens is further configured to reflect and diverge the laser beams of first color, and increase the divergence angle of the laser beams of first color by a first angle;
and/or,
the second combining lens is further configured to reflect and diverge the laser beams of second color, and increase the divergence angle of the laser beams of second color by a second angle.

5. The laser projection apparatus according to claim 4, wherein a beam spot of the laser beams of first color diverged by the first combining lens is located within a beam spot of the laser beams of third color;
and/or,
a beam spot of the laser beams of second color diverged by the second combining lens is located within the beam spot of the laser beams of third color.

6. The laser projection apparatus according to claim 2, wherein the third combining lens includes:
a first surface, the first surface being a surface of the third combining lens proximate to the second combining lens, and the laser beams of first color and the laser beams of second color exiting from the second combining lens being incident on the first surface;
a second surface, the second surface being a surface of the third combining lens away from the second combining lens, and the laser beams of third color emitted from the third laser-exit region being incident on the second surface; and
a convex structure disposed on the first surface and protruding toward the second combining lens, the convex structure being configured to diverge the laser beams of first color and the laser beams of second color, and increase the divergence angle of the laser beams of first color and the divergence angle of the laser beams of second color; wherein
the beam spot adjustment structure includes the convex structure.

7. The laser projection apparatus according to claim 6, wherein beam spots of the laser beams of first color and the laser beams of second color diverged by the convex structure are located within a beam spot of the laser beams of third color.

8. The laser projection apparatus according to claim 2, wherein the combining lens group further includes:
a beam expanding component configured to diverge an incident laser beam and increase a divergence angle of the laser beam; wherein
the beam spot adjustment structure includes the beam expanding component.

9. The laser projection apparatus according to claim 8, wherein the beam expanding component satisfies one of the following:
the beam expanding component includes a first beam expanding component, and is disposed on laser-exit sides of the first laser-exit region and the second laser-exit region; or
the beam expanding component includes a second beam expanding component, and is disposed between the second combining lens and the third combining lens.

10. The laser projection apparatus according to claim 8, wherein the beam expanding component includes a one-piece structure or two separate structures.

11. The laser projection apparatus according to claim 2, wherein the third combining lens is disposed proximate to the beam outlet, and positions where the laser beams of first color and the laser beams of second color are incident on the third combining lens are located within a region where the laser beams of third color are incident on the third combining lens.

12. The laser projection apparatus according to claim 2, wherein
polarization directions of the laser beams of first color emitted by the first laser-exit region and the laser beams of second color emitted by the second laser-exit region are same, and are perpendicular to a polarization direction of the laser beams of third color emitted by the third laser-exit region;
the laser source assembly further includes a phase retarder, and the phase retarder being configured to change a polarization direction of a laser beam incident on the phase retarder; wherein
the phase retarder is located in the beam paths of the laser beams of first color and the laser beams of second color before being combined with the laser beams of third color, or the phase retarder is located in a beam path of the laser beams of third color before being combined with the laser beams of first color and the laser beams of second color.

13. The laser projection apparatus according to claim 12, wherein at least a part of the phase retarder is located between the first laser-exit region and the first combining lens and/or between the second laser-exit region and the second combining lens, and the phase retarder is provided according to a wavelength of at least one of the laser beams of first color or the laser beams of second color.

14. The laser projection apparatus according to claim 13, wherein the phase retarder includes:
   a first phase sub-retarder located between the first laser-exit region and the first combining lens, and provided according to a wavelength of the laser beams of first color; and
   a second phase sub-retarder located between the second laser-exit region and the second combining lens, and provided according to a wavelength of the laser beams of second color.

15. The laser projection apparatus according to claim 12, wherein the phase retarder is located between the second combining lens and the third combining lens, and the phase retarder is provided according to a wavelength of at least one of the laser beams of first color or the laser beams of second color.

16. The laser projection apparatus according to claim 12, wherein the phase retarder is located between the third laser-exit region and the third combining lens, and the phase retarder is provided according to a wavelength of the laser beams of third color.

17. The laser projection apparatus according to claim 1, wherein
   a divergence angle of the laser beams of first color emitted by the first laser-exit region and a divergence angle of the laser beams of second color emitted by the second laser-exit region are less than a divergence angle of the laser beams of third color emitted by the third laser-exit region;
   a divergence angle of the laser beams of first color after being combined with the laser beams of third color is greater than the divergence angle of the laser beams of first color exiting from the first laser-exit region, and is less than or equal to the divergence angle of the laser beams of third color; and
   a divergence angle of the laser beams of second color after being combined with the laser beams of third color is greater than the divergence angle of the laser beams of second color exiting from the second laser-exit region, and is less than or equal to the divergence angle of the laser beams of third color.

18. The laser projection apparatus according to claim 1, wherein the first laser-exit region emits one of green laser beams and blue laser beams, the second laser-exit region emits another of the green laser beams and the blue laser beams, and the third laser-exit region emits red laser beams.

19. The laser projection apparatus according to claim 1, wherein the first laser-exit region, the second laser-exit region, and the third laser-exit region are arranged adjacent to each other in sequence, and an area of the third laser-exit region is greater than an area of the first laser-exit region or an area of the second laser-exit region respectively.

20. The laser projection apparatus according to claim 1, wherein the first laser-exit region, the second laser-exit region, and the third laser-exit region are located on a same laser device.

* * * * *